US010668650B2

(12) United States Patent
Obata et al.

(10) Patent No.: US 10,668,650 B2
(45) Date of Patent: Jun. 2, 2020

(54) THERMOSETTING COMPOSITION, AND METHOD FOR MANUFACTURING THERMOSET RESIN

(71) Applicant: IDEMITSU KOSAN CO., LTD., Chiyoda-ku (JP)

(72) Inventors: Yutaka Obata, Ichihara (JP); Takeshi Iwasaki, Ichihara (JP); Daichi Ogawa, Ichihara (JP); Haruhiko Mori, Ichihara (JP)

(73) Assignee: IDEMISTU KOSAN CO., LTD., Chiyoda-ku (JP)

(*) Notice: Subject to any disclaimer, the term of this patent is extended or adjusted under 35 U.S.C. 154(b) by 510 days.

(21) Appl. No.: 15/321,517

(22) PCT Filed: Jun. 22, 2015

(86) PCT No.: PCT/JP2015/003111
§ 371 (c)(1),
(2) Date: Dec. 22, 2016

(87) PCT Pub. No.: WO2015/198580
PCT Pub. Date: Dec. 30, 2015

(65) Prior Publication Data
US 2017/0203476 A1 Jul. 20, 2017

(30) Foreign Application Priority Data

Jun. 23, 2014 (JP) .................. 2014-128158

(51) Int. Cl.
C08K 3/00 (2018.01)
B29C 39/26 (2006.01)
H01L 33/60 (2010.01)
C08L 33/04 (2006.01)
B29C 45/02 (2006.01)
C08F 20/10 (2006.01)
C08F 292/00 (2006.01)
C08F 2/44 (2006.01)
B29C 45/14 (2006.01)
B29C 45/54 (2006.01)
C08K 3/36 (2006.01)
C08K 3/013 (2018.01)
B29C 39/00 (2006.01)
C08K 9/06 (2006.01)
H01L 33/48 (2010.01)
H01L 33/62 (2010.01)
B29K 101/10 (2006.01)
B29C 33/10 (2006.01)
B29L 11/00 (2006.01)
B29C 33/00 (2006.01)
B29L 31/34 (2006.01)

(52) U.S. Cl.
CPC ............ B29C 39/26 (2013.01); B29C 39/003 (2013.01); B29C 45/02 (2013.01); B29C 45/14336 (2013.01); B29C 45/54 (2013.01); C08F 2/44 (2013.01); C08F 20/10 (2013.01); C08F 292/00 (2013.01); C08K 3/013 (2018.01); C08K 3/36 (2013.01); C08K 9/06 (2013.01); C08L 33/04 (2013.01); H01L 33/486 (2013.01); H01L 33/60 (2013.01); H01L 33/62 (2013.01); B29C 33/0038 (2013.01); B29C 33/10 (2013.01); B29K 2101/10 (2013.01); B29L 2011/00 (2013.01); B29L 2011/0083 (2013.01); B29L 2031/34 (2013.01); H01L 2224/48091 (2013.01); H01L 2224/48247 (2013.01); H01L 2924/181 (2013.01); H01L 2933/0033 (2013.01); H01L 2933/0058 (2013.01); H01L 2933/0066 (2013.01)

(58) Field of Classification Search
CPC .. C08K 3/013; C08K 9/06; C08K 3/36; C08F 2/44; C08F 20/10; C08F 292/00; C08L 33/04; B29C 39/26; B29C 39/003; B29C 45/02; B29C 45/54; H01L 33/486; H01L 33/60
USPC ......................................................... 523/218
See application file for complete search history.

(56) References Cited

U.S. PATENT DOCUMENTS

2003/0045628 A1* 3/2003 Konayagi ............. C08L 51/003
524/558
2011/0115132 A1* 5/2011 Burdzy ............... B29C 35/0888
264/478

(Continued)

FOREIGN PATENT DOCUMENTS

CN 103168057 A 6/2013
JP 2012-131074 A 7/2012

(Continued)

OTHER PUBLICATIONS

Machine Translation of JP 2014-095038 (Year: 2014).*

(Continued)

Primary Examiner — Hannah J Pak
(74) Attorney, Agent, or Firm — Oblon, McClelland, Maier & Neustadt, L.L.P.

(57) ABSTRACT

A thermosetting composition comprising: (A) a (meth)acrylate compound having a viscosity at 25° C. of 1 to 300 mPa·s with which a substituted or unsubstituted aliphatic hydrocarbon group including 6 or more carbon atoms is ester-bonded; (B) spherical silica; and (C) a white pigment, and having a shear viscosity at 25° C. and 10 s$^{-1}$ of 1 Pa·s or more and 500 Pa·s or less and a shear velocity at 25° C. and 100 s$^{-1}$ of 0.3 Pa·s or more and 100 Pa·s or less.

8 Claims, 3 Drawing Sheets

(56) References Cited

U.S. PATENT DOCUMENTS

| | | | | |
|---|---|---|---|---|
| 2011/0304034 A1* | 12/2011 | Dejima | ............... | H01L 23/293 257/680 |
| 2012/0123054 A1* | 5/2012 | Matsumoto | ............. | C08K 3/22 524/701 |
| 2013/0237660 A1* | 9/2013 | Iwasaki | ............... | C08F 290/062 524/531 |
| 2013/0345359 A1* | 12/2013 | Onai | ..................... | H01L 33/501 524/588 |
| 2015/0322233 A1 | 11/2015 | Iwasaki et al. | | |

FOREIGN PATENT DOCUMENTS

| | | |
|---|---|---|
| JP | WO 2013/146081 A1 | 10/2013 |
| JP | 2014-80503 A | 5/2014 |
| JP | 2014-95038 A | 5/2014 |
| WO | WO 2012/056972 A1 | 5/2012 |
| WO | WO 2014/054256 A1 | 4/2014 |

OTHER PUBLICATIONS

International Search Report dated Sep. 29, 2015 in PCT/JP2015/003111 (submitting English translation only, previously filed).

International Preliminary Report on Patentability and Written Opinion dated Dec. 27, 2016 in PCT/JP2015/003111 (submitting English translation only).

Combined Office Action and Search Report dated Jul. 10, 2018 in Chinese Patent Application No. 201580034292.3, (with English translation of categories of cited documents), 9 pages.

Office Action dated Oct. 24, 2017 in Japanese Patent Application 2014-128158 (with unedited computer generated English translation).

* cited by examiner

THERMOSETTING COMPOSITION, AND METHOD FOR MANUFACTURING THERMOSET RESIN

TECHNICAL FIELD

The invention relates to a thermosetting composition and a method for producing a thermoset resin.

BACKGROUND ART

A light-emitting device utilizing a light-emitting semiconductor such as light-emitting diode (LED) that has been widespread in recent years is normally produced by a method in which a light-emitting semiconductor (LED) is fixed on a lead frame of a molded product obtained by integrally molding a synthetic resin as a reflector in the shape of a concave on a lead frame, followed by sealing with a sealant such as an epoxy resin or a silicone resin.

As the material for a reflector, Patent Document 1 discloses a composition that provides a cured product excellent in heat resistance and weatherability, as well as in adhesiveness with peripheral components, which is obtained by mixing a thermoset resin such as an acrylate resin with a white pigment such as titanium oxide.

When titanium oxide as a representative white pigment is used, the viscosity of a thermosetting composition tends to increase, and the fluidity of the thermoset resin liquid is deteriorated. If the fluidity of the liquid is poor, when a resin molded product is formed in a lead frame, bending or un-filling of a reflector, formation of voids or burrs in a lead frame molded body occur, and hence mass producibility of a light-emitting device becomes insufficient. Further, it is required that only a slight effect be exerted on continuous moldability if a thermosetting composition is stored at normal temperature.

RELATED ART DOCUMENTS

Patent Document

Patent Document 1: WO2012/056972

SUMMARY OF THE INVENTION

An object of the invention is to provide a thermosetting composition that is excellent in continuous moldability, i.e. can prevent un-filling, generation of voids and formation of burrs in the resulting molded product when molding a reflector in a lead frame.

Another object of the invention is to provide a method for molding a thermosetting composition and a method for producing a thermoset resin that is excellent in continuous moldability, i.e. can prevent un-filling, generation of voids, and formation of burrs in the resulting molded product when molding a reflector in a lead frame.

According to the invention, the following thermosetting composition or the like can be provided.

1. A thermosetting composition comprising the following components (A) to (C), which has a shear viscosity at 25° C. and 10 $s^{-1}$ of 1 Pa·s or more and 500 Pa·s or less and a shear viscosity at 25° C. and 100 $s^{-1}$ of 0.3 Pa·s or more and 100 Pa·s or less:
   (A) a meth(acrylate) compound having a viscosity at 25° C. of 1 to 300 mPa·s with which a substituted or unsubstituted alicyclic hydrocarbon group including 6 or more carbon atoms is ester-bonded;
   (B) spherical silica; and
   (C) a white pigment.
2. The thermosetting composition according to 1, wherein the content of component (B) is 10 to 90 mass % and the content of component (C) is 3 to 50 mass % relative to 100 mass % of the total of the components (A) to (C).
3. The thermosetting composition according to 1 or 2, wherein the (meth)acrylate compound is a (meth)acrylate compound with which one or more aliphatic hydrocarbon groups selected from a substituted or unsubstituted adamantyl group, a substituted or unsubstituted norbornyl group, a substituted or unsubstituted isobornyl group and a substituted or unsubstituted dicyclopentanyl group is ester-bonded.
4. The thermosetting composition according to any one of 1 to 3, which further comprises one or more components selected from the following components (D) to (F), wherein the content of the component (C) is 3 to 50 mass % and the content of the component (B) is 10 to 90 mass % relative to 100 mass % of the total of the components (A) to (F):
   (D) (meth)acrylic acid or a monofunctional (meth)acrylate compound having a polar group;
   (E) a monofunctional (meth)acrylate compound other than the components (A) and (D); and
   (F) one or more compounds selected from the group consisting of polyfunctional (meth)acrylate compounds other than the component (A).
5. The thermosetting composition according to any one of 1 to 4, wherein the spherical silica is subjected to a (meth)acrylsilane surface treatment.
6. The thermosetting composition according to any one of 1 to 5, wherein the average particle size of primary particles of the spherical silica is 0.1 to 100 μm.
7. The thermosetting composition according to any one of 1 to 6, which further comprises one or more components selected from the following components (G) and (H):
   (G) a plate-like filler; and
   (H) nano particles.
8. A method for producing a thermoset resin comprising the steps of:
   supplying the thermosetting composition according to any one of 1 to 7 to a plunger;
   filling by means of the plunger the thermosetting composition that is filled in the plunger in the cavity of a mold;
   heat curing the thermosetting composition in the cavity; and taking out the thermoset resin that is cured.
9. The method for producing a thermoset resin according to 8, wherein the temperature of the mold in the cavity part is 100° C. or higher and 180° C. or lower.
10. The method for producing a thermoset resin according to 8 or 9, wherein, during the step of filling by means of the plunger the thermosetting composition that is filled in the plunger in the cavity of the mold, the thermosetting composition is filled in the cavity of the mold through a flow channel of which the temperature is controlled to be 50° C. or lower.
11. The method for producing a thermoset resin according to any one of 8 to 10, wherein, during the step of filling by means of the plunger the thermosetting composition that is filled in the plunger in the cavity of the mold, a gate system is provided in a flow channel between the plunger and the cavity for shutting off the flow of the thermosetting composition and the transfer of heat.

12. The method for producing a thermoset resin according to 11, wherein the gate of the gate system is opened, the thermosetting composition is filled in the cavity of the mold, and as for the heat curing, the injection pressure of the thermosetting composition is increased after the start of the curing, pressure holding starts before the completion of the curing, and after the completion of the pressure holding, the gate of the gate system is closed to complete the heat curing.

13. The method for producing a thermoset resin according to any one of 8 to 12, wherein the filling step and the heat curing step are conducted within 0.2 to 3 minutes.

Advantageous Effects of the Invention

According to the invention, it is possible to provide a thermosetting composition that is excellent in continuous moldability, i.e. can prevent un-filling, generation of voids, and formation of burrs in the resulting molded product when molding a reflector in a lead frame, According to the invention, it is possible to provide a method for molding a thermosetting composition and a method for producing a thermoset that is excellent in continuous moldability, i.e. can prevent un-filling, generation of voids, and formation of burrs in the resulting molded product when molding a reflector in a read frame.

MODE FOR CARRYING OUT THE INVENTION

[Thermosetting Composition]

Figure 1:
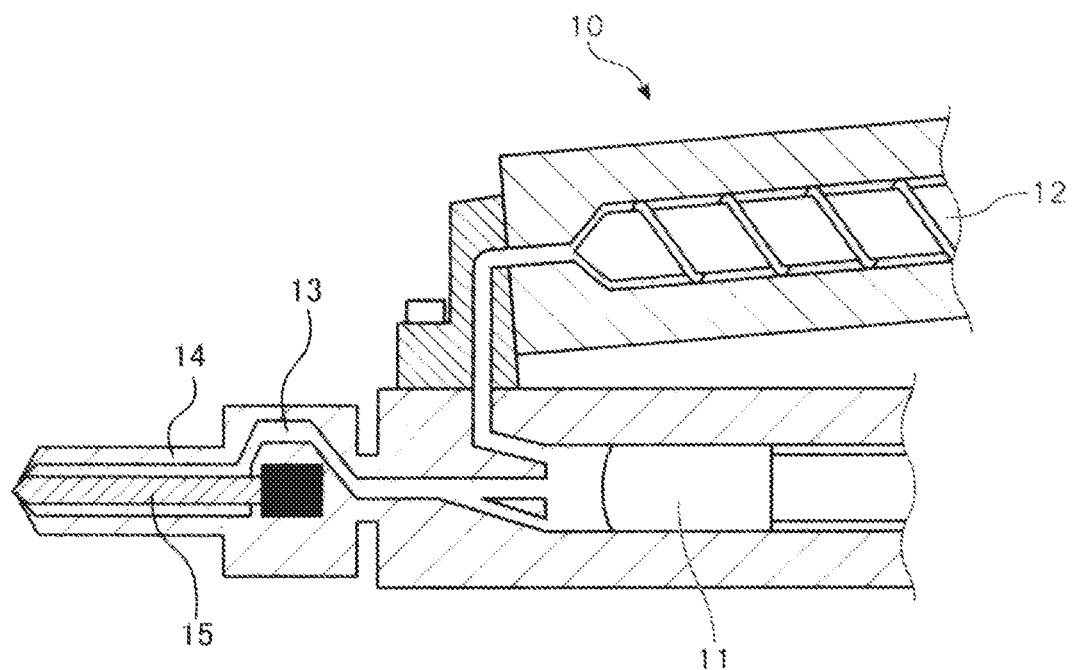
FIG. 1 is a schematic cross-sectional view of a filling apparatus that can be used in the method for producing a thermoset resin of the invention.

The thermosetting composition of the invention comprises the following components (A) to (C) and has a shear viscosity at 25° C. and 10 s$^{-1}$ of 1 Pa·s or more and 500 Pa·s or less, and a shear viscosity at 25° C. and 100 s$^{-1}$ of 0.3 Pa·s or more and 100 Pa·s or less.

(A) (meth)acrylate compound having a viscosity at 25° C. of 1 to 300 mPa·s with which a substituted or unsubstituted alicyclic hydrocarbon group is ester-bonded (B) spherical silica (C) a white pigment.

As for the thermosetting composition of the invention (hereinafter, often simply referred to as the "composition of the invention"), by allowing the composition comprising the above-mentioned components (A) to (C) to have a shear viscosity at 25° C. and 10 s$^{-1}$ of 1 Pa·s or more and 500 Pa·s or less and to have a shear viscosity at 25° C. and 100 s$^{-1}$ of 0.3 Pa·s or more and 100 Pa·s or less, it is possible to allow the composition to be improved in continuous moldability, as well as to suppress generation of burrs in the molded product. Further, it can exhibit excellent storageability at normal temperature.

If each shear viscosity is not satisfied and low, a large amount of burrs is formed, and deburring may become necessary, and is not preferable since it deteriorates the appearance of the product. On the other hand, a high shear viscosity is also unfavorable, since un-filling of a molded product occurs in a molded product to cause appearance of a product to be deteriorated.

The shear viscosity at 100 s$^{-1}$ and the shear viscosity at 10 s$^{-1}$ respectively correspond to the first half and the second half of the pouring of the raw material in a cavity. If each value is low, burrs are formed at each state. If the shear viscosity is high, un-filling occurs in each state. Therefore, the viscosities at the both shear velocities are adjusted to be within the above-mentioned range.

The viscosity of the composition can be in the above-mentioned range by appropriately adjusting the amount of each component in the composition. The shear viscosity of the composition can be confirmed by a viscoelastic measurement apparatus.

Hereinbelow, an explanation will be made on each of the components contained in the composition of the invention:

[Component (A): (Meth)acrylate compound having a viscosity at 25° C. of 1 to 300 Pa·m with which a substituted or unsubstituted alicyclic hydrocarbon group including 6 or more carbon atoms is ester-bonded]

The composition of the invention comprises, as the component (A), a (meth)acrylate compound having a viscosity at 25° C. of 1 to 300 Pa·m with which a substituted or unsubstituted alicyclic hydrocarbon group including 6 or more carbon atoms is ester-bonded (hereinafter often referred to as compound (A)).

Since compound (A) provides a polymer having a high glass transition temperature, by incorporating it in the composition, when the composition is used as a raw material of a reflector of an optical semiconductor, it is possible to improve heat resistance and light resistance.

The number of carbon atoms of the alicyclic hydrocarbon group of the compound (A) is 6 or more, preferably 6 to 30, with 7 to 15 being more preferable.

The alicyclic hydrocarbon group including 6 or more carbon atoms may have a substituent. As the substituted or unsubstituted alicyclic hydrocarbon group including 6 or more carbon atoms, a substituted or unsubstituted adamantyl group, a substituted or unsubstituted norbornyl group, a substituted or unsubstituted isobomyl group, a substituted or unsubstituted dicyclopentanyl group and a substituted or unsubstituted cyclohexyl group can be given, for example.

The compound (A) is preferably a (meth)acrylate compound (I) having an adamantyl group represented by the following general formula, a (meth)acrylate compound (II) having an isobomyl group, a (meth)acrylate compound (III)

having a norbornyl group and a (meth)acrylate compound (IV) having a dicyclopentanyl group.

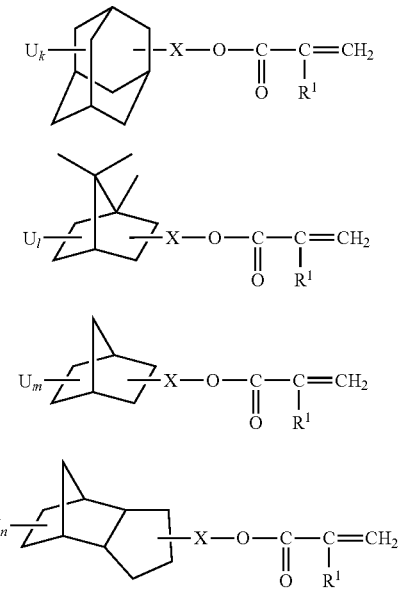

In the formulas (I), (II), (III) and (IV), R¹s independently represent a hydrogen atom or a methyl group.

Xs independently represent a single bond, an alkylene group including 1 to 4 carbon atoms or an oxyalkylene group including 1 to 4 carbon atoms.

As the alkylene group including 1 to 4 carbon atoms, a methylene group, an ethylene group, a trimethylene group, a propylene group, a tetramethylene group, a butylene group, a 2-methyltrimethylene group or the like can be given.

As the oxyalkylene group including 1 to 4 carbon atoms, an oxymethylene group, an oxyethylene group, an oxypropylene group, an oxybutylene group or the like can be given. Among these Xs, a single bond is preferable in respect of heat resistance.

U is a hydrogen atom, an alkyl group including 1 to 4 carbon atoms, a halogen atom, hydroxide group or =O in which two Us are bonded to each other. k is an integer of 1 to 15. l is an integer of 1 to 8. m is an integer of 1 to 11 n is an integer of 1 to 15.

When plural Us are present in the formula, the plural Us may be the same as or different from each other.

The compound (A) is further preferably adamantyl methacrylate, 1-norbonyl methacrylate, 1-isobornyl methacrylate or 1-dicyclopentanyl methacrylate, more preferably 1-adamantyl methacrylate, 1-norbornyl methacrylate and 1-isobornyl methacrylate. These compounds have a viscosity at 25° C. of 1 to 300 mPa·s.

The (meth)acrylate compound with which a substituted or unsubstituted alicyclic hydrocarbon group including 6 or more carbon atoms is ester-bonded may be used singly or in combination of two or more.

The viscosity of the compound (A) is 1 to 300 mPa·s, more preferably 1 to 200 mPa·s, with 1 to 100 mPa·s being further preferable. By incorporating the compound (A) having such a low viscosity into the composition, it is possible to increase the filling property of spherical silica and a white pigment.

The viscosity of the compound (A) can be measured by a rheometer or a rotary viscometer, for example.

[Component (B): Spherical Silica]

As the component (B), the composition contains spherical silica ($SiO_2$).

The white pigment (C) such as barium titanate mentioned later tends to be precipitated in a liquid, and hence, the usable amount thereof is limited. By using spherical silica in combination with the white pigment, the content of an inorganic substance in the composition can be further increased, whereby material strength, reflectance, heat resistance and light resistance can be further improved.

Further, it is possible to keep the fluidity of the composition, whereby the filling property at the time of molding can be improved.

The average diameter of primary particles of spherical silica is 0.1 to 100 μm, for example, by measurement by laser diffraction. The average diameter of primary particles of spherical silica is preferably 0.5 to 70 μm, with 1 to 50 μm being more preferable. With this particle diameter, the filling property of the spherical silica can be improved or blockage of the molding channel can be suppressed.

It is preferred that the spherical silica be subjected to a surface treatment (acrylsilane treatment, in particular).

By organically modifying the spherical silica by reacting a hydroxyl group of the surface of the spherical silica with a silane coupling agent (in particular, an acrylic silane coupling agent), the wettability of the spherical silica can be improved, and as a result, dispersibility of the spherical silica in organic components (component (A) and arbitrary components (D), (E) and (F)) can be improved, and the strength of a cured product can be improved.

The content of the spherical silica in the composition is, relative to 100 mass % of the total of the components (A), (B) and (C), or relative to 100 mass % of the total of the components (A) to (H) if one or more of arbitrary components (D), (E), (F), (G) and (H) mentioned later are present, 10 to 90 mass %, for example, preferably 20 to 85 mass %, more preferably 30 to 80 mass %, with 35 to 80 mass % being further preferable.

If the content of the spherical silica in the composition is less than 10 mass % relative to the above-mentioned total mass %, the viscosity of the composition is lowered, and as a result, burrs may be generated and storability at normal temperature may be deteriorated. As for the physical properties, the material strength may be insufficient. If the content of the spherical silica is larger than 90 mass %, the viscosity may be increased to deteriorate fluidity.

[Component (C): White Pigment]

The composition of the invention comprises a white pigment as the component (C).

As for specific examples of the white pigment, barium titanate, zirconium oxide, zinc oxide, boron nitride, titanium dioxide, alumina, zinc sulfide, magnesium oxide, potassium titanate, barium sulfate, calcium carbonate, silicone particles or the like can be given. Among these, in respect of high reflectance and easiness in availability, barium titanate, zirconium oxide, zinc oxide, boron nitride and titanium dioxide are preferable. In respect of a higher reflectance, titanium dioxide is preferable. A white pigment can be used singly or in combination of two or more.

As for the crystal type of titanium dioxide, rutile type titanium dioxide and anatase type titanium dioxide are present. Anatase type titanium dioxide may deteriorate the resin due to its light catalyst function. Therefore, in the invention, it is preferable to use rutile type titanium dioxide.

In respect of dispersibility of a white pigment in the composition, the volume average particle diameter of a white pigment is preferably 0.01 to 20 μm, more preferably 0.05 to 10 μm, and further more preferably 0.1 to 1 μm. The volume average particle size can be obtained as D50 in the particle size distribution measurement by the laser type light diffraction method.

A white pigment may be hollow particles. If a white pigment is hollow particles, visible rays that pass the outer shell of hollow particles are reflected in the hollow part. Therefore, in order to increase the reflectance in the hollow part, it is preferred that difference in refractive index between a part that constitutes the hollow particles and a gas that is present within the hollow particle be large. The gas that is present in the hollow particles is normally air, but it may be an inert gas such as nitrogen and argon. Further, the inside of the hollow particles may be vacuum.

A white pigment may be subjected to an appropriate surface treatment with a silicon compound, an aluminum compound, an organic substance or the like. As the surface treatment, a (meth)acrylsilane treatment, an alkylation treatment, a trimethylsilylation treatment, a silicone treatment, a treatment with a coupling agent or the like can be given.

The content of the white pigment in the composition is, relative to 100 mass % of the total of components (A), (B) and (C), or relative to 100 mass % of the total of components (A) to (H), if one or more of the arbitrary components (D), (E), (F), (G) and (H) are present, 3 to 50 mass %, for example, preferably 4 to 40 mass %, more preferably 5 to 35 mass %, and further preferably 5 to 25 mass %.

If the content of the white pigment in the composition is less than 3 mass % relative to the total mass % mentioned above, the degree of whiteness may be deteriorated. If the content of the white pigment is larger than 50 mass %, the viscosity becomes too high, resulting in deteriorated fluidity.

The composition of the invention may comprise other polymerizable acrylate compounds than the compound (A) as an arbitrary component. As the arbitrary component, one or more selected from the following components (D), (E) and (F) can be given.

Component (D): (Meth)acrylic acid or a monofunctional (e late compound having a polar group Component (E): Monofunctional (meth)acrylate compound other than components (A) and (D)

Component (F): Polyfunctional (meth)acrylate compound other than component (A)

Hereinafter, the component (D), the component (E) and the component (F) may often be referred to as compound (D), compound (E) and compound (F), respectively.

The total content of the compounds (A), (D), (E) and (F) in the composition of the invention is preferably 1 to 40 mass %. more preferably 5 to 30 mass %, and further preferably 10 to 20 mass %, relative to 100 mass % of the total of components (A) to (F) or relative to 100 mass % of the total of components (A) to (G).

The content of the compound (A) in the composition of the invention is, if components (D), (E) and (F) are present, preferably 10 to 70 mass %, more preferably 15 to 60 mass %, and further preferably 20 to 50 mass %, relative to 100 mass % of the total of the compounds (A), (D), (E) and (F).

[Component (D): (Meth)Acrylic Acid or Monofunctional (meth)Acrylate Compound Having a Polar Group]

The compound (D) is (meth)acrylic acid or a monofunctional (meth)acrylate compound having a functional group. It is not a compound with which an alicyclic hydrocarbon group including 6 or more carbon atoms is bonded, and hence, is not overlapped with the compound (A).

Since the compound (D) has polarity, by incorporation thereof into the composition, it forms a hydrogen bond or the like with a metal surface or the like having polarity, thereby to improve the adhesiveness of the composition. Further, due to the presence of a polar group, wettability is improved. Meanwhile, while an alkylene glycol group may affect bestowment of adhesiveness, alkylene glycol (meth)acrylate is not included in the compound (D).

As the monofunctional (meth)acrylate compound having a polar group, a (meth)acrylate compound with which a substituent including an atom other than carbon and hydrogen is ester-bonded can be given. As the substituent, a hydroxyl group, an epoxy group, a glycidyl ether group, a tetrahydrofurfuryl group, an isocyanate group, a carboxyl group, an alkoxysilyl group, a phosphoric acid ester group, a lactone group, an oxetane group, a tetrahydropyranyl group, an amino group or the like can be given.

As specific examples of the monofunctional (meth)acrylate compound having a polar group, 2-hydroxyethyl (meth)acrylate, 2-hydroxypropyl (meth)acrylate, 2-hydroxybutyl (meth)acrylate, 4-hydroxybutyl (meth)acrylate (e.g., product name: 4-HBA, manufactured by Nippon Kasei Chemical Co., Ltd.), cyclohexane dimethanol mono(meth)acrylates (e.g., product name: CHMMA, manufactured by Nippon Kasei Chemical Co., Ltd.), glycidyl (meth)acrylate, 4-hydroxybutyl acrylate glycidyl ether (e.g., product name: 4-HBAGE, manufactured by Nippon Kasei Chemical Co., Ltd.), tetrahydrofurfuryl (meth)acrylate, 2-isocyanatoethyl (meth)acrylate, 2-(meth)acryloyloxyethyl succinate, 2-(meth)acryloyloxyethyl hexahydrophthalic acid, 3-(meth)acryloxypropyltrimethoxysilane, 3-(meth)acryloxypropylmethyldimethoxysilane, 3-(meth)acryloxypropyltriethoxysilane, 3-(meth)acryloxypropylmethyldiethoxysilane, 2-(meth)acryloyloxyethylphosphate, bis(2-(meth)acryloyloxyethyl)phosphate, KAYAMER PM-2, KAYAMER PM-21 (product name, manufactured by Nippon Kayaku Co., Ltd.), y-butyrolactone (meth)acrylate, (meth)acrylic acid (3-methyl-3-oxetanyl), (meth)acrylic acid (3-ethyl-3-oxetanyl), tetrahydrofurfuryl (meth)acrylate, dimethylaminoethyl (meth)acrylate, diethylaminoethyl (meth)acrylate or the like can be given.

In the invention, as the compound (D), one selected from the above-mentioned (meth)acrylic acid and the above-mentioned (meth)acrylate compound having a polar group may be used singly or in combination of two or more.

In respect of adhesiveness, the content of the compound (D) in the composition of the invention is, preferably 1 to 40 mass %, more preferably 5 to 15 mass %, and further preferably 7 to 25 mass %, relative to 100 mass % of the total of the compounds (A), (D), (E) and (F).

[Component (E): Monofunctional (Meth)Acrylate Compound Other than the Components (A) and (D)]

[Component (F): Polyfunctional (Meth)Acrylate Compound Other than the Component (A)]

The compound (E) is a monofunctional group (meth)acrylate compound other than the compounds (A) and (D). By incorporating the compound (E) into the composition of the invention, viscosity or hardness of a cured product can be adjusted, and occurrence of cracks or the like can be suppressed.

Further, the compound (F) is a polyfunctional (meth)acrylate compound other than the compound (A). A polyfunctional (meth)acrylate compound other than the compounds (A), (D) and (E) may be incorporated into the composition within an amount range that does not inhibit the advantageous effects of the invention in respect of mechanical strength or curing speed.

As the (meth)acrylate compound other than the compounds (A) and (D) (compounds (E) and (F)), at least one (meth)acrylate compound selected from the group consisting of (meth)acrylate-modified silicone oil, (meth)acrylate having an aliphatic hydrocarbon group, polyalkylene glycol (meth)acrylate having a number average molecular weight of 400 or more, urethane acrylate, epoxy acrylate and polyester acrylate can be given. As the compound (E), among these compounds, a monofunctional (meth)acrylate compound can be selected and used. As the compound (F), among these compounds, a polyfunctional (meth)acrylate compound can be selected and used.

The (meth)acrylate-modified silicone oil that can be used in the invention is a compound that has an acrylic group and/or a methacrylic group at its end, and preferably is a compound having dialkylpolyoxysiloxane in its skeleton. In many cases, this (meth)acrylate-modified silicone oil is a modified product of dimethylpolysiloxane. Instead of a methyl group, all or part of the alkyl group in the dialkylpolysiloxane skeleton may be replaced with a phenyl group or an alkyl group other than a methyl group. As the alkyl group other than a methyl group, an ethyl group, a propyl group or the like can be given. As the commercial products of these compounds, single-end reactive silicone oil (for example, X-22-174DX, X-22-2426, X-22-2475), both-end reactive silicone oil (for example, X-22-164A, X-22-164C, X-22-164E) (these are products manufactured by Shin-Etsu Chemical Co., Ltd.), methacrylate-modified silicone oil (for example, BY16-152D, BY16-152, BY16-1520) (these are products manufactured by Dow Corning Toray Co., Ltd.) can be used.

As the (meth)acrylate-modified silicone oil, it is possible to use polydialkylsiloxane having an acryloxyalkyl end or a methacryloxyalkyl end. Specifically, methacryloxypropyl-ended polydimethylsiloxane, (3-acryloxy-2-hydroxypropyl)-ended polydimethylsiloxane, an ABA type triblock copolymer composed of acryloxy-ended ethylene oxide dimethylsiloxane (A block) and ethylene oxide (B block), methacryloxypropyl-ended branched polydimethylsiloxane or the like can be given.

The (meth)acrylate having an aliphatic hydrocarbon group that can be used in the invention is a compound in which a (meth)acrylate group is bonded with a residue obtained by removing a hydrogen atom from an aliphatic hydrocarbon compound.

As the aliphatic hydrocarbon compound that can derive the (meth)acrylate having an aliphatic hydrocarbon group that can be used in the invention, alkane is preferable. Alkane including 12 or more carbon atoms is more preferable in respect of physical properties of a cured product of the invention.

In the (meth)acrylate having an aliphatic hydrocarbon group that can be used in the invention, the number of the (meth)acrylate group is not specifically restricted, and it may be one or plural. If the number of the (meth)acrylate group is one, the aliphatic hydrocarbon group is preferably an alkyl group, and more preferably a straight-chain alkyl group including 12 or more (preferably 12 to 24, more preferably 12 to 18) carbon atoms. If the number of the (meth)acrylate group is two, the aliphatic hydrocarbon group is preferably an alkylene group, and is more preferably a straight-chain alkylene group including 12 or more (preferably 12 to 24, more preferably 12 to 18) carbon atoms.

As specific examples of the alkyl group including 12 or more carbon atoms, a dodecyl group (including lauryl group), a tridecyl group, a tetradecyl group, a hexadecyl group, an octadecyl group (including a stearyl group), an eicosyl group, a triacontyl group, a tetracontyl group or the like can be given. The alkyl group or the alkylene group including 12 or more carbon atoms may be an alkyl group or an alkylene group derived frog a hydride of a polymer such as polybutadiene and polyisoprene. As specific examples of the alkylene group including 12 or more carbon atoms, a divalent residue obtained by removing a hydrogen atom from the above-mentioned alkyl group can be given.

As specific examples of the (meth)acrylate having an aliphatic hydrocarbon group, lauryl(meth)acrylate, tridecyl (meth)acrylate, tetradecyl(meth)acrylate, hexadecyl(meth) acrylate, stearyl(meth)acrylate, eicosyl(meth)acrylate, triacontyl(meth)acrylate, tetracontyl(meth)acrylate or the like, or an acrylic or methacrylic compound having a hydrogenated polybutadiene skeleton or a hydrogenated polyisoprene skeleton such as hydrogenated polybutadiene di(meth) acrylate and hydrogenated polyisoprene di(meth)acrylate.

By using polyalkylene glycol (meth)acrylate having a number average molecular weight of 400 or more, the composition of the invention can provide a cured product having an excellent tenacity. In the polyalkylene glycol (meth)acrylate having a number average molecular weight of 400 or more that can be used in the invention, the number of a (meth)acrylate group is not particularly restricted, and it may be one or plural.

The number average molecular weight of the compound is preferably 400 to 10,000, more preferably 450 to 5,000, and further preferably 500 to 3,000, in respect of tenacity or adhesiveness, and compatibility with the components (A) and (D).

As specific examples of the polyalkylene glycol (meth) acrylate having a number average molecular weight of 400 or more, polyethylene glycol di(meth) acrylate, polypropylene glycol di(meth)acrylate, polybutylene glycol di(meth) acrylate, ethoxylated trimethylolpropane tri(meth)acrylate, ethoxylated pentaerythritol tetra(methacrylate) or the like can be given. Among these, in respect of tenacity or adhesiveness, polyethylene glycol di(meth)acrylate is preferable.

It is preferred that the urethane acrylate, the epoxy acrylate and the polyester acrylate that can be used in the invention do not have an aromatic group in respect of light resistance. The number-average molecular weight thereof is preferably 100 to 100,000, more preferably 500 to 80,000, and further preferably 1,000 to 50,000 in respect of tenacity or compatibility with components (A) and (D).

Other than those mentioned above, as specific examples of the monofunctional or polyfunctional (meth)acrylate compounds (compounds (E) and (F)), the followings can be given: polyethylene glycol such as di(meth)acrylate or polypropylene glycol di(meth)acrylate having a number average molecular weight of less than 400; ethyl(meth) acrylate, n-butyl (meth)acrylate, isobutyl (meth)acrylate, t-butyl (meth)acrylate, isoamyl (meth)acrylate, 2-ethylhexyl (meth) acrylate, isooctyl (meth)acrylate, isodecyl (meth)acrylate, caprolactone (meth)acrylate, ethoxydiethylene glycol (meth)acrylate, methoxytriethylene glycol (meth)acrylate, 2-ethylhexyldiglycol (meth)acrylate, methoxypolyethylene glycol (meth)acrylate, methoxydipropylene glycol (meth) acrylate, polypropylene glycol mono(meth)acrylate, tetrahydrofurfuryl (meth)acrylate, trifluoroethyl (meth)acrylate, ethylene glycol di(meth)acrylate, diethylene glycol di(meth) acrylate, triethylene glycol di(meth)acrylate, tetraethylene glycol di(meth)acrylate, dipropylene glycol di(meth)acrylate, tripropylene glycol di(meth)acrylate, neopentyl glycol di(meth)acrylate, ethoxylated neopentyl glycol di(meth) acrylate, propoxylated neopentyl glycol di(meth)acrylate, 1,3-butylene glycol di(meth)acrylate, 1,4-butanediol di(meth)acrylate, 3-methyl-1,5-pentanediol di(meth)acrylate, 1,6-hexanediol di(meth)acrylate, ethoxylated hexanediol di(meth)acrylate, 1,9-nonanediol di(meth)acrylate, 1,10-decanediol di(meth)acrylate, 1,12-dodecanediol dimethacrylate, 2-methyl-1,8-octanediol di(meth)acrylate, glycerin di(meth)acrylate, tricyclodecane dimethanol di(meth)acrylate, hydroxypivalic acid neopentyl glycol acrylic acid adduct, 2-hydroxy-3-acryloyloxy propyl (meth)acrylate, ethoxylated hydrogenated bisphenol A di(meth)acrylate, propoxylated hydrogenated bisphenol A di(meth)acrylate, glycerin tri(meth)acrylate, ethoxylated glycerin (meth)acrylate, propoxylated glycerin (meth)acrylate, trimethylolpropane tri(meth)acrylate, ethoxylated trimethylolpropane tri(meth)acrylate, propoxylated trimethylolpropane tri(meth)acrylate, pentaerythritol tri(meth)acrylate, pentaerythritol tetra(meth)acrylate, ditrimethylolpropane tetra(meth)acrylate, ethoxylated pentaerythritol tetra(meth)acrylate, dipentaerythritol penta(meth)acrylate, dipentaerythritol hexa(meth)acrylate, ethoxylated isocyanuric acid tri(meth)acrylate, ε-caprolactone-modified tris(2-acryloxy ethyl)isocyanurate or the like.

In the invention, as the compound (E), among the above-mentioned monofunctional (meth)acrylate compounds, it is possible to use one singly or two or more in combination.

The content of the compound (E) in the composition of the invention is preferably 10 to 80 mass %, more preferably 15 to 60 mass %., and further preferably 15 to 50 mass % relative to 100 mass % of the total of compounds (A), (D), (E) and (F) in respect of tenacity or adhesiveness.

In the invention, as the compound (F), among the polyfunctional (meth)acrylate compounds other than the above-mentioned component (A), it is possible to use one singly or two or more in combination.

The content of the compound (F) in the composition of the invention is preferably 5 to 60 mass %, more preferably 10 to 45 mass %, and further preferably 15 to 40 mass % relative to 100 mass % of the total of the compounds (A), (D), (E) and (F) in order not to inhibit the advantageous effects of the invention.

It is preferred that the composition of the invention comprise one or more selected from the following components (G) and (H).
(G) A plate-like filler
(H) Nano particles
[Component (G): Plate-Like Filler]

By incorporating a plate-like filler as the component (G), the viscosity of the composition or the hardness of the resulting cured product can be adjusted, and generation of burrs at the time of molding the composition can be suppressed, As specific examples of the plate-like filler, talc, kaolin, mica, clay, sericite, glass flakes, synthetic hydrotalcite, various metal foils, graphite, molybdenum disulfide, tungsten disulfide, boron nitride, plate-like iron oxide, plate-like calcium carbonate, plate-like aluminum hydroxide or the like can be given. Among them, talc, kaolin, mica, clay, graphite and glass flakes are preferable. Talc is more preferable since lowering in reflectance by mixing thereof is not observed The plate-like fillers may be used singly or in combination of two or more.

The content of the component (G) in the composition is 1 to 30 mass % for example, preferably 3 to 20 mass %, more preferably 5 to 15 mass %, relative to 100 mass % of the total of components (A) to (H).

By incorporating nano particles as the component (H), the viscosity of the composition can be adjusted, and the storage stability of the composition at normal temperature can be kept, whereby troubles at the time of molding can be reduced.

As the nano particles, silver, gold, silicon, silicon carbide, silica, copper oxide, iron oxide, cobalt oxide, titanium carbide, cerium oxide, ITO, ATO, hydroxyl apatite, graphene/graphene oxide, monolayer carbon nanotube, multi-layer carbon nanotube, fullerene, diamond, mesoporous carbon or the like can be given. Silicon carbide, silica and titanium carbide are preferable. In respect of keeping the degree of whiteness, silica and titanium carbide are more preferable.

The nano particles can be used singly or in combination of two or more.

The content of the component (H) in the composition is 0.05 to 10 mass %, for example, preferably 0.07 to 7 mass %, and more preferably 0.1 to 5 mass % relative to 100 mass % of the total of the components (A) to (H). If the content of the component (H) is 0.05 mass % or less, the stability at the time of storing at normal temperature is poor, and solid components may be precipitated. If the content of the component (H) is 10 mass % or more, the appearance of the molded product (transferability) may be deteriorated.

The components (A), (D), (E) and (F) of the thermosetting composition of the invention lower the viscosity of the thermosetting composition and the components (B), (C), (G) and (H) of the thermosetting composition of the invention increase the viscosity of the thermosetting composition.

In respect of allowing the shear viscosity at 25° C. and 10 s$^{-1}$ of the thermosetting composition to be 1 Pa·s or more and 500 Pa·s or less and a shear viscosity at 25° C. and 100 s$^{-1}$ of 0.3 Pa·s or more and 100 Pa·s or less, the content of the components (A), (D), (E) and (F) of the thermosetting composition is 7 to 50 mass %, preferably 7 to 35 mass % and more preferably 8 to 25 mass %, relative to 100 mass % of the total content of components (A) to (H), and the content of the components (B), (C), (G) and (H) of the thermosetting composition is 50 to 93 mass %, more preferably 60 to 93 mass % and further preferably 75 to 92 mass %, relative to 100 mass % of the total content of the components (A) to (H).

By adjusting the viscosity of the thermosetting composition to be in the above-mentioned viscosity range, it is possible to obtain a molded product improved in continuous moldability, as well as to suppress formation of burrs in the resulting molded product.

The thermosetting composition of the invention comprises the components (A), (B) and (C), and further may optionally comprise at least one selected from the components (D), (E), (F), (G) and (H).

In the thermosetting composition of the invention, the total content of the components (A) to (H) may be 85 wt % or more, 95 wt % or more or 99 wt % or more, for example. The thermosetting composition may consist only of the components (A) to (H).

[Additive]

The thermosetting composition of the invention may comprise, in addition to the above-mentioned components (A) to (H), polymerization initiators, antioxidants, light stabilizers, ultraviolet absorbers, plasticizers, inorganic fillers, colorants, antistatic agents, lubricants, mold release agents, flame retardants, leveling agent, de-foaming agents or the like within a range that does not inhibit advantageous effects of the invention. As for these additives, known additives can be used.

Hereinafter, an explanation will be made on additives that can be used preferably in the composition of the invention.

(Polymerization Initiator)

By polymerizing the composition of the invention with heat, a cured product can be obtained. In order to accelerate the polymerization reaction, a polymerization initiator may be contained in the composition. No specific restrictions are imposed on the kind of a polymerization initiator. However, a radical polymerization initiator can be given, for example.

No specific restrictions are imposed on the kind of a radical polymerization initiator. Ketone peroxides, hydroperoxides, diacylperoxides, dialkylperoxides, peroxyketals, alkyl pereste s (peroxy esters), peroxycarbonates or the like can be given.

As specific examples of ketone peroxide, methyl ethyl ketone peroxide, methyl isobutyl ketone peroxide, acetyl acetone peroxide, cyclohexanone peroxide, methylcyclohexanone peroxide or the like can be given.

As specific examples of hydroperoxide, 1,1,3,3-tetramethylbutyl hydroperoxide, cumene hydroperoxide, t-butyl hydroperoxide, p-methane hydroperoxide, diisopropylbenzene hydroperoxide or the like can be given.

As specific examples of diacyl peroxide, diisobutyryl peroxide, bis-3,5,5-trimethyl hexanol peroxide, dilauroyl peroxide, dibenzoyl peroxide, m-toluylbenzoyl peroxide, succinic acid peroxide or the like can be given.

As specific examples of dialkyl peroxide, dicumyl peroxide, 2,5-dimethyl-2,5-di(t-butylperoxy)hexane, 1,3-bis(t-butylperoxy isopropyl)hexane, t-butylcumyl peroxide, di-t-butyl peroxide, di-t-hexyl peroxide, 2,5-dimethyl-2,5-di(t-butylperoxy)hexyne-3 or the like can be given.

As specific examples of peroxyketal, 1,1-di-t-hexyl peroxy-3,3,5-trimethylcyclohexane, 1,1-di-t-hexylperoxy cyclohexane, 1,1-di-t-butyl-peroxy-2-methylcyclohexane, 1,1-di-t-butylperoxy cyclohexane, 2,2-di(t-butylperoxy)butane, butyl 4,4-bis-t-butylperoxy pentanoic acid or the like can be given, As specific examples of alkylperesters (peroxyesters), 1,1,3,3-tetramethylbutylperoxy neodecanoate, α-cumylperoxy neodecanoate, t-butylperoxy neodecanoate, t-hexylperoxy neodecanoate, t-butylperoxy neoheptanoate, t-hexylperoxypivalate, t-butylperoxypivalate, 1,1,3,3-tetramethylbutylperoxy-2-ethylhexanoate, t-amylperoxy-2-ethylhexanoate, t-butylperoxy-2-ethylhexanoate, t-butylperoxy isobutyrate, di-t-butylperoxy hexahydroterephthalate, 1,1,3,3-tetramethylbutylperoxy-3,5,5-trimethylhexanoate, t-amylperoxy 3,5,5-trimethyl hexanoate, t-butylperoxy 3,5,5-trimethyl hexanoate, t-butylperoxy acetate, t-butylperoxy benzoate, di-butylperoxytrimethyl adipate, 2,5-dimethyl-2,5-di-2-ethylhexanoylperoxy hexane, t-hexylperoxy-2-ethylhexanoate, t-hexylperoxy isopropyl monocarbonate, t-butylperoxy laurate, t-butylperoxy isopropyl monocarbonate, t-butylperoxy-2-ethylhexyl monocarbonate, 2,5-dimethyl-2,5-di-benzoylperoxyhexane, or the like can be given.

As specific examples of peroxy carbonates, di-n-propylperoxy dicarbonate, diisopropyl peroxycarbonate, di-4-t-butylcyclohexylperoxy carbonate, di-2-ethylhexylperoxy carbonate, di-sec-butylperoxy carbonate, di-3-methoxybutyl peroxydicarbonate, di-2-ethylhexylperoxy dicarbonate, diisopropyloxy dicarbonate, t-amylperoxyisopropyl carbonate, t-butylperoxyisopropyl carbonate, t-butylperoxy-2-ethylhexyl carbonate, 1,6-bis(t-butylperoxycarboxyloxy) hexane or the like can be given.

In the invention, the above-mentioned radical polymerization initiators may be used singly or in combination of two or more.

The content of the radical polymerization initiator in the composition of the invention is preferably 0.01 to 10 parts by mass, more preferably 0.1 to 5 parts by mass relative to 100 parts by mass of the total of the components (A) to (H).

(Anti-Oxidant)

As the anti-oxidant, a phenol-based anti-oxidant, a phosphorus-based anti-oxidant, a sulfur-based anti-oxidant, a vitamin-based anti-oxidant, a lactone-based anti-oxidant, an amine-based anti-oxidant or the like can be given.

As the phenol-based anti-oxidant, tetrakis[methylene-3-(3,5-di-t-butyl-4-hydroxyphenyl)propyonate]methane, β-(3,5-di-t-butyl-4-hydroxyphenyl)propionic acid stearyl ester, 1,3,5-trimethyl-2,4,6-tris(3,5-di-t-butyl-4-hydroxybenzyl) benzene, tris(3,5-di-t-butyl-4-hydroxybenzyl)isocyanurate, tris[(3,5-di-t-butyl-4-hydroxyphenyl)propionyloxyethyl] isocyanurate, 2,6-di-t-butyl-4-methylphenol, 3,9-bis[1,1-dimethyl-2-{6-(3-t-butyl-4-hydroxy-5-methylphenyl) propionyloxy}ethyl]-2,4,8,10-tetra-oxa-spiro[5,5]undecane, tris(2,6-dimethyl-3-hydroxy-4-t-butylbenzyl)isocyanurate or the like can be given. As examples thereof, commercial products such as IRGANOX 1010, IRGANOX 1076, IRGANOX 1330, IRGANOX 3114, IRGANOX 3125, IRGANOX 3790 (these IRGANOX products are manufactured by BASF Japan), CYANOX 1790 (manufactured by American Cyanamid Company), SUMILIZER BHT, SUMILIZER GA-80 (these Sumilizer products are manufactured by Sumitomo Chemical Company, Ltd.) can be given. (These are product names.)

As the phosphorus-based anti-oxidant, tris(2,4-di-t-butylphenyl)phosphite, 2-[[2,4,8,10-tetrakis(1,1-dimethylethyl) dibenzo [d,f] [1,3,2] dioxaphosphepine-6-yl]oxy]-N,N-bis [2-[2,4,8,10-tetrakis(1,1-dimethylethyl)dibenzo [d,f] [1,3,2] dioxaphosphine-6-yl]oxy-ethanamine, cyclic neopentanetetrayl bis(2,6-di-t-butyl-4-methylphenyl)phosphite, distearyl pentaerythritol diphosphite or the like can be given. For example, commercial products such as IRGAFOS 168, IRGAFOS 12, IRGAFOS 38 (these IRGAFOS products are manufactured by BASF Japan Co., Ltd.), ADK STAB 329K, ADK STAB PEP36, ADK STAB PEP-8 (these ADK products are manufactured by ADEKA Corporation), Sandstab P-EPQ (manufactured by Clariant International Ltd.), Weston 618, Weston 619G, Weston 624 (these Weston products are manufactured by General Electric Company) or the like can be used.

(These are product names.)

As the sulfur-based anti-oxidant, dilauryl thiodipropionate, distearyl thiodipropionate, dimyristyl thiodipropionate, lawylstearyl thiodipropionate, pentaerythritol tetrakis (3-dodecyl-thiopropionate), pentaerythritol tetrakis(3-lauryl thiopropionate) or the like can be given. For example, commercial products such as DSTP "Yoshitomi", DLTP "Yoshitomi", DLTOIB, DMTP "Yoshitomi" (these products are manufactured by API Corporation), Seenox 412S (manufactured by Shipro Kasei Co., Ltd.), Cyanox 1212 (manufactured by American Cyanamid Company), SUMILIZER TP-D (manufactured by Sumitomo Chemical Company, Ltd.) or the like can be used. (These product names.)

As the vitamin-based antioxidant, tocopherol, 2,5,7,8-tetramethyl-2(4',8',12'-trimethyltridecyl)coumarone-6-ol or the like can be given. For example, commercial products such as IRGANOX E201 (manufactured by BASF Japan Co., Ltd.) or the like can be used.

As the lactone-based antioxidant, those disclosed in JP-A-H07-233160 and JP-A-H07-247278 can be used. Further, HP-136 (product name, manufactured by BASF Japan Co., Ltd., compound name: 5,7-di-t-butyl-3-(3,4-dimethylphenyl)-3H-benzofuran-2-one) or the like can also be used.

As the amine-based antioxidant, commercial products such as IRGASTAB FS 042 (manufactured by BASF Japan Co., Ltd.), GENOX EP (manufactured by Crompton Manufacturing Company, Ltd., Name of compound: Dialkyl-N-methylamineoxide) or the like can be given. (These are product names).

These anti-oxidants can be used singly or in combination of two or more. The content of the anti-oxidant in the composition of the invention is preferably 0.005 to 5 parts by mass, more preferably 0.02 to 2 parts by mass, relative to 100 parts by mass of the total of the components (A) to (H), in order not to hinder the advantageous effects of the invention.

(Photostabilizer)

As the photostabilizer, an arbitrary photostabilizer such as a UV absorber or a hindered amine-based photostabilizer can be used. A hindered amine-based photostabilizer is preferable.

As specific examples of the hindered amine-based photostabilizer, ADK STAB LA-52, LA-57, LA-62, LA-63, LA-67, LA-68, LA-77, LA-82, LA-87 and LA-94 (these LA products are manufactured by ADEKA Corporation), Tinuvin 123, 144, 440, 662, 765, 770DF, Tinuvin XT 850 FF, Tinuvin XT 855 FF, Chimassorb 2020, 119, 944 (these Tinuvin products are manufactured by BASF Japan Co., Ltd.), Hostavin N30 (manufactured by Hoechst AG), Cyasorb UV-3346, UV-3526 (manufactured by Cytec Technology, Ltd.), Uval 299 (manufactured by GLC Co., Ltd.), Sanduvor PR-31(r anufactured by Clariant International Ltd.) or the like can be used (these are all product names).

As specific examples of the UV absorber, Adekastab LA-31, Adekastab LA-32, Adekastab LA-36, Adekastab LA-29, Adekastab LA-46, Adekastab LA-F70, Adekastab 1413 (these Adekastab products are manufactured by ADEKA Corporation), Tinuvin P, Tinuvin 234, Tinuvin 326, Tinuvin 328, Tinuvin 329, Tinuvin 213, Tinuvin 571, Tinuvin 765, Tinuvin 1577ED, Chimassorb 81, Tinuvin 120 (these products are manufactured by BASF Japan Co., Ltd.), or the like can be used. Among these, Tinuvin series manufactured by BASF Japan Co., Ltd. are preferable, with Tinuvin 765 being more preferable.

These photostabilizers can be used singly or n combination of two or more. The content of the photostabilizer in the composition of the invention is preferably 0.005 to 5 parts by mass, more preferably 0.02 to 2 parts by mass, relative to 100 parts by mass of the total of the components (A) to (H) in order not to hinder the advantageous effects of the invention.

(Mold-Releasing Agent)

For an internal mold-releasing agent, it is required to have the following properties, i.e. it is dissolved and well-dispersed in a (meth)acrylate compound. Further, its molecular movement can easily occur during curing the composition, since it is in a molten state with a low viscosity. When the composition cures completely, it separates from resin components being curing completely, and is present between a mold and components cured, whereby it has mold-releasing property. In addition, when released from a mold, it has a low viscosity in a molten state to have a high mold-releasing property. Although no specific restrictions are imposed on the internal mold-releasing agent, an aliphatic compound is desirable.

The aliphatic compound used as an internal mold-releasing agent has a melting point of preferably −40° C. to 180° C., and further preferably −30° C. to 180° C. By using the aliphatic compound having a melting point of −40° C. or higher, there is no fear that the compound is gasified during curing and bubbles are generated in a product to make external appearance poor, and it exhibits good mold-releasing property. By using an aliphatic compound having a melting point of 180° C. or lower, solubility is improved to obtain good external appearance and mold-releasing property.

As the above-mentioned aliphatic compound, a compound represented by the following formula (V) is preferable.

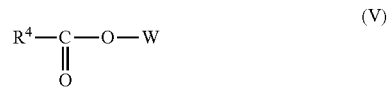

wherein in the formula (V), $R^4$ is an aliphatic hydrocarbon group including 6 to 30 carbon atoms.

W is a hydrogen atom, a metal atom or a hydrocarbon group including 1 to 8 carbon atoms.

If W is a metal atom, O and W are ionically bonded,

The aliphatic hydrocarbon group represented by $R^4$ in the formula (V) may be linear or branched. As for the bonding state in the molecular chain, it may comprise only a single bond or may comprise a multiple bond. Specifically, a saturated aliphatic hydrocarbon groups or an unsaturated aliphatic hydrocarbon groups may be given. The number of a multiple bond in the aliphatic unsaturated hydrocarbon group may be one or more than one.

The number of carbon atoms of the hydrocarbon group of $R^4$ is 6 to 30. If the number of carbon atoms is less than 6, the compound is evaporated or the like at the time of curing, and as a result, no aliphatic compound can be present between the mold and the material. Therefore, mold releasing property may not be exhibited or air bubbles may remain in the material. If the number of carbon atoms exceeds 30, the mobility of the material is lowered, and an aliphatic compound is incorporated into the material to cause the material to be opaque or to inhibit mold-releasing property from being exhibited. The number of carbon atoms of $R^4$ is preferably 6 to 26, more preferably 8 to 22.

As the metal atom in W of the formula (V), an alkali metal such as lithium and sodium, an alkaline earth metal such as magnesium and calcium, zinc and aluminum can be given.

When W is an alkali metal or aluminum, the valence thereof becomes divalence or higher. Therefore, the formula (V) of the aliphatic compound is represented by $(R^4-CO-O)_q-W$, and q is 2 to 4.

The aliphatic hydrocarbon group in W of the formula (V) may be linear or branched. As for the bonding state in the molecular chain, it may comprise only a single bond or may comprise a multiple bond. Specifically, a saturated aliphatic hydrocarbon group or an unsaturated hydrocarbon group may be given.

The number of a multiple bond in the aliphatic unsaturated hydrocarbon group may be one or more than one. The number of carbon atoms of the aliphatic hydrocarbon group of W is 1 to 8. If the number of carbon atoms is 8 or more, an increase in melting point or a lowering in solubility of the aliphatic compound may be caused. As a result, the aliphatic compound may be incorporated into the resin components or may be localized in the resin components at the time of curing, whereby mold-releasing property may not be exhibited or a molded product may become opaque. The number of carbon atoms of the aliphatic hydrocarbon group of W is preferably 1 to 6.

In order o allow the aliphatic compound to exhibit good mold releasing property, when W in the aliphatic compound represented by the formula (V) is a hydrogen atom, $R^4$ is preferably an aliphatic hydrocarbon group including 6 to 20 carbon atoms. If W is a metal atom, $R^4$ is preferably an aliphatic hydrocarbon group including 6 to 18 carbon atoms. If W is an aliphatic hydrocarbon group, the total number of carbon atoms of $R^4$ and W is preferably 7 to 30.

The content of the mold-releasing agent in the invention is 0.01 to 10 parts by mass, preferably 0.01 to 5 parts by mass, relative to 100 parts by mass of the total of the components (A) to (H). If the content of the mold releasing agent exceeds 10 parts by mass, there may be a possibility that transferability of a mold shape or shape stability to heat cannot be kept. On the other hand, if the content of the mold releasing agent is less than 0.01 part by mass, there may be a possibility that mold releasing property cannot be obtained.

The composition of the invention can be obtained by mixing the above-mentioned components (A) to (H) with a prescribed mixing ratio. The mixing method is not particularly restricted, and a known arbitrary means such as an agitator (mixer) can be used. In addition, the components can be mixed at normal temperature, while cooling or with heating under normal pressure, under reduced pressure or under pressure.

The composition of the invention is a suitable material for producing a reflector for an optical semiconductor, and can reduce curvature or un-filling of a lead frame molded product that can occur at the time of producing a light-emitting device. Further, the mass-producibility and lifetime of light reflectance of the light-emitting device can be improved, and the amount of burrs formed after molding can be reduced, whereby removal of burrs can be omitted. As a result, the quality of the molded product after a treatment for resistance to electrolysis can be improved.

Further, the composition of the invention is a material that can prolong the time for which it can be used under the temperature of molding.

A cured product can be produced by using the composition of the invention by transfer molding, compression molding or injection molding.

In the case of transfer molding, by using a transfer molding machine, molding can be conducted with a clamping force of 5 to 20 kN, at a molding temperature of 100 to 190° C. for a molding time of 30 to 500 seconds, preferably at a molding temperature of 100 to 180° C. for a molding time of 30 to 180 seconds. In the case of compression molding, by using a compression molding machine, molding can be conducted at a molding temperature of 100 to 190° C. for 30 to 600 seconds, preferably at a molding temperature of 110 to 170° C. for 30 to 300 seconds. For any of the molding methods, post-curing may be conducted, for example, at a temperature of 150 to 185° C. for 0.5 to 24 hours.

By using liquid injection molding, it can be molded at a clamping force of 10 kN to 40 kN, at a molding temperature of 100 to 190° C. for a molding time of 30 to 500 seconds, preferably at a molding temperature of 100 to 180° C. for 20 to 180 seconds.

When the composition of the invention is molded by transfer molding, compression molding, liquid resin injection molding, insert molding or the like, preliminary polymerization may be conducted.

[Method for Producing Thermoset Resin]

The method for producing a thermoset resin of the invention comprises the following steps (1) to (4);
(1) A step of supplying the thermosetting composition of the invention to a plunger;
(2) A step of filling the thermosetting composition that is filled in the plunger in a cavity of a mold;
(3) A step of heat curing the thermosetting composition in the cavity; and
(4) A step of taking out the heat-cured thermoset resin The thermosetting composition of the invention has a low viscosity. Therefore, the liquid components thereof can be filled in a gap of 1 μm when filling is conducted while applying pressure in the mold. On the other hand, since the thermosetting composition of the invention contains spherical silica or a white pigment, during the process of filling the thermosetting composition in a cavity in the mold, the "liquid releasing" phenomenon in which only resin components of the thermosetting composition are filled may occur. Further, the composition of the invention is thermosetting, it should not be heated until immediately before molding, and it is required to be sufficiently heated at the time of molding. In addition, there may be a possibility that curing is not conducted completely if oxygen is present at the time of curing by heating.

By the molding method of the invention, by using a plunger-type injection molding machine provided with a plunger instead of a screw type injection molding machine, a phenomenon of leakage (back flow) or release of a liquid can be prevented even in the case of a low-viscous composition. Further, the composition is cured by heat within the cavity, thermosetting in the absence of oxygen is possible. Therefore, the molding method according to the invention is preferable as a method for molding the thermoset resin of the invention.

FIG. 1 is a view showing one embodiment of a molding machine with which the injection molding method of the invention can be implemented.

The molding machine shown in FIG. 1 is an injection molding machine having a plunger mechanism that extrudes the thermosetting composition of the invention to a mold, and is provided with a filling apparatus 10 having a plunger 11 shown in FIG. 1 and a mold 20 having a cavity 21 shown in FIG. 2(A). Although not shown, it is provided with a decompressor as a degassing means connected to the pores for degassing the cavity 21 in the mold 20, a heating apparatus as a heating means connected to the mold 20, and a cooling apparatus. A molding material is a thermoset resin of the invention.

As the filling apparatus 10, a known filling apparatus provided with a plunger can be used. Normally, the filling apparatus 10 provided with the plunger 11 is, as shown in FIG. 1, provided with a feed part and a non-return function. By allowing a screw 12 to rotate, materials that have been input from an input port not shown are fed, stirred and mixed. In this embodiment, since a raw material composition that is a homogenous liquid is input, stirring and mixing are not necessary. Therefore, no screw configuration is necessary, and only the raw material feeding from the inlet and provision of the non-returning function may be enough.

In the method for molding a thermosetting composition of the invention, in the process of filling in the cavity of a mold a thermosetting composition that has been supplied to the plunger, the thermosetting composition is filled in the cavity of a mold through a flow path of which the temperature has been controlled to 50° C. or lower. If the molding method of the invention is implemented by using the apparatus shown in FIG. 2, the above-mentioned flow path corresponds to the flow channel 13 of the raw material composition in the filling apparatus 10 and the introduction channel in the mold 20. The flow path may be controlled to have a temperature of 50° C. or lower by using the cooling part 14.

In the method for molding a thermosetting composition of the invention, during a process in which a thermosetting composition filled in the plunger is filled in the cavity of a mold by means of the plunger, a gate system in which flow of a curable liquid and transfer of heat are shut off is provided to the flow path between the plunger and the cavity. Hereinbelow, the molding method of the invention will be explained with reference to FIG. 2.

Figure 2:
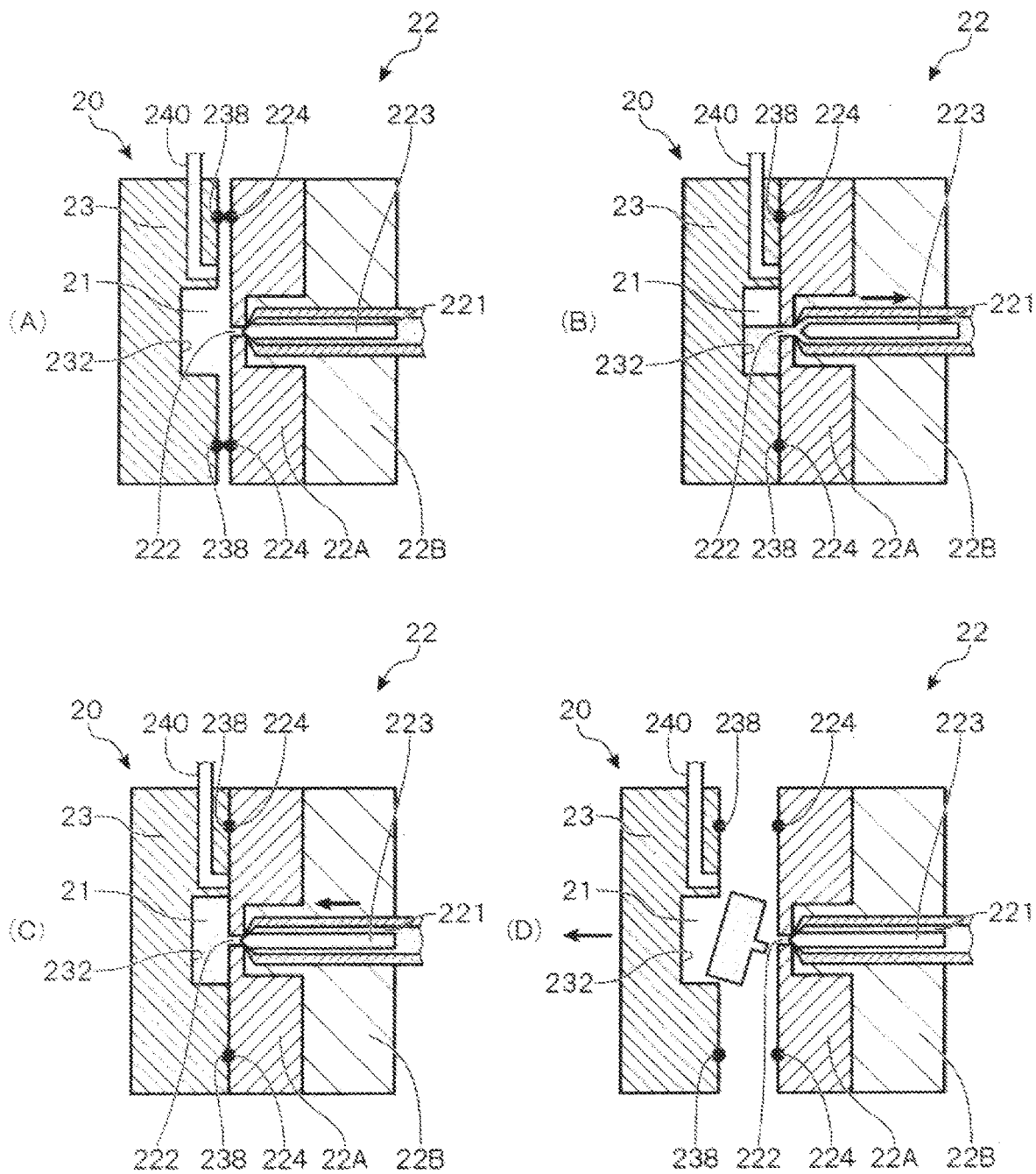
FIG. 2 is a schematic cross-sectional view of a mold of a molding machine that can be used in the method for producing a thermosetting composition of the invention.

When the molding method of the invention is implemented by using the apparatus shown in FIG. 2, a needle 223 and an opening 222 correspond to the above-mentioned gate system. As mentioned above, the needle 223 moves to the movable die 23, and closes the opening 222, whereby the an introduction channel 221 is separated in front of a heating part 22A. The composition that has been introduced into the introduction channel 221 is accumulated in a cooling part 22B, whereby flow of the composition and transfer of heat can be shut off. As the system for shutting off the flow of the composition and transfer of heat, a valve gate system, a shut-off nozzle system or the like can be given.

The heating apparatus is an apparatus that heats the heating part 22A and the movable mold 23. By heating the heating part and the movable mold, it is possible to allow the temperature in the cavity 232 (often referred to as the "cavity temperature") to be a predetermined temperature. In the molding method of the invention, the mold temperature of the cavity part is allowed to be 100° C. or higher and 180° C. or lower.

The cooling apparatus is an apparatus that cools the flow path of the raw material composition. Specifically, the filling apparatus 10 and the cooling part 22B of the mold 20 is preferably cooled to 10° C. or higher and 50° C. or lower.

In the case of injection molding, the needle 15 in FIG. 1 and the needle 223 in FIG. 2, and the flow channel 13 in FIG. 1 and the introduction channel 221 in FIG. 2, respectively correspond.

The molding method of the thermoset resin by using the above-mentioned molding machine comprises a step of supplying a prescribed amount of a thermosetting composition to a plunger (supply step), a step of filling by means of the plunger the thermosetting composition filled in the plunger in the cavity of a mold (filling step), a step of heat curing the thermoset resin in the cavity (curing step) and a step of taking out a cured product obtained by heat curing the thermoset resin (mold-releasing step), for example.

(Supply Step)

When molding is conducted by transfer molding or compression, weighing can be conducted by inserting into a plunger part in the mold an appropriate amount of a material by using a supply apparatus such as a syringe.

When molding is conducted by injection molding, the raw material composition is supplied from an inlet (not shown) to the filling apparatus 10 shown in FIG. 1. The supplied raw material composition is extruded to a flow channel 12, and a prescribed amount is weighed by the plunger 11. After the completion of the measurement or before the injection, the screw 12 advances, and exhibits a function as a non-return valve when the plunger 11 operates. During this period of time, since the flow path is cooled by the cooling apparatus, the raw material composition flows smoothly without being cured.

(Filling Step)

The filling step corresponds to FIG. 2(B).

When injecting the thermosetting composition to the cavity, it is required to release the air in the cavity through a vent, or to decompress inside of the cavity through pores such as a decompression tube 240 in FIG. 2 that is connected to a decompression apparatus and enable to decompress inside of the cavity. The reason is that, during the process of injecting a thermosetting composition to a cavity and filling it in the cavity completely, the vent serves to release the air in the cavity, and decompression in the cavity enables complete filling by allowing the inside of the cavity to be free from the presence of air. If these mechanisms are not present, another mechanism that allows the air in the cavity to be released at the time of filling the raw material will become necessary (e.g. vent mechanism).

In order to mold a thermosetting composition, first, the movable mold 23 is allowed to approach the fixed mold 22, and clamping is conducted (FIG. 2(A)). At a position where an elastic member 238 of the movable mold 23 abuts an elastic member 224 of the fixed mold 22, movement of the movable mold 23 once stops.

Filling of a thermosetting composition in the cavity is conducted by opening the gate of a gate system (i.e. the needle 223 is moved to the side of the fixed mold 22), followed by filling of the thermosetting composition in the cavity 21 of the mold. A heating part 22A provided in the movable mold 23 and the fixed mold 22 are heated all the time, and set such that the cavity temperature becomes 60° C. or higher, preferably 100° C. or higher and 180° C. or lower, and particularly preferably 110° C. or higher and 170° C. or lower.

Meanwhile, when an injection molding machine is used, when injection from an injection part to the cavity start, the nozzle of a shut-off nozzle (in some cases, a valve gate) is opened, the plunger in an injection part is allowed to move, whereby the thermosetting components are injected into the cavity. When a transfer molding machine is used, all of the raw materials from the inside of the plunger to the cavity part are cured. Therefore, the flow of the raw materials to the cavity is only required to be possible, and there is no necessity that transfer of heat is shut off.

(Curing Step)

The curing step corresponds to FIG. 2(C).

When filling of the raw material composition to the cavity 21 is completed, curing of the raw material composition simultaneously starts. In order to improve transferability of a molded product, it is necessary to cure by applying a prescribed pressure. That is, it is preferred that the plunger 11 be in a state that has been pressurized at 1.0 MPa or more and 15 MPa or less. This pressure that is applied to the raw material composition in order to improve the transferability is called holding pressure.

In the curing step, it is preferred that the injection pressure of a thermosetting composition be increased after the start of curing, and pressure holding be conducted before completion of curing, and after completion of the pressure holding, the gate of the gate system is closed to conduct heat curing. Specifically, the gate is closed by advancing the needle 223 and closing the opening part 222. During the molding process, the cooling apparatus is operated, the entire area of the flow channel of the raw material composition, i.e. the filling apparatus 10 of the molding machine and the cooling part 22B provided in the fixed mold 22 of the mold 20 are cooled. At this time, it is preferred that the entire area of the flow channel be kept at 10° C. or higher and 50° C. or lower, with 30° C. or lower being particularly preferable.

Figure 3:
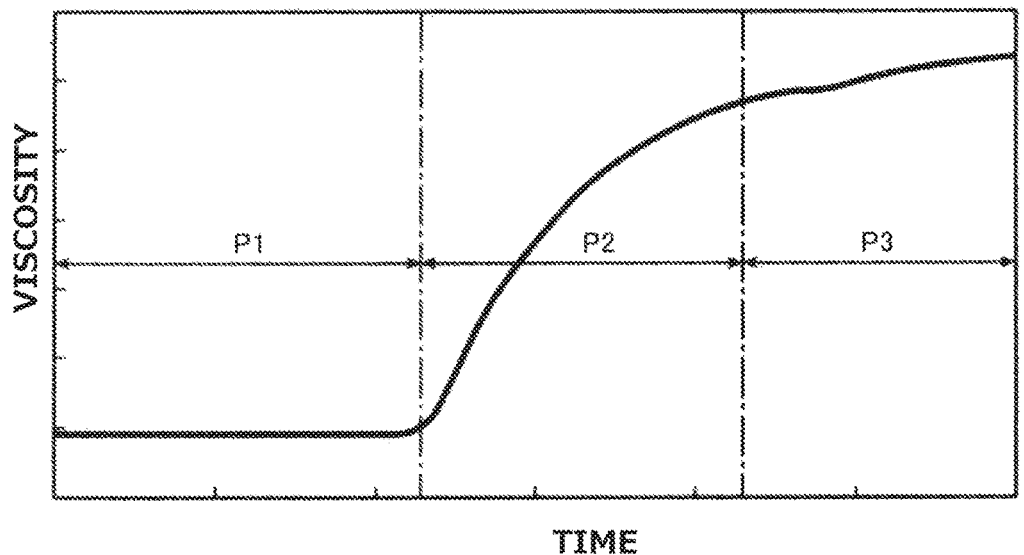
FIG. 3 is a view showing the relationship between the viscosity and time according to one embodiment of the method for producing a thermoset resin of the present invention.

Hereinbelow, an explanation will be made on the pressure holding in the plunger 11 and timing when the pressure holding starts. FIG. 3 is a view showing the relationship between the viscosity of the raw material composition and the time in the present embodiment. In FIG. 3, the period P1 from the injection of the raw material to the cavity to the completion of the filling corresponds to an introduction period during which heat is applied to the raw material and the curing starts. The curing process is divided into two steps; i.e. the initial curing period P2 during which the material starts to be cured by applying heat and the material is cured and the later curing period P3 during which the curing is completed. During the introduction period P1, viscosity of the raw material composition does not change and is kept to be low. During the initial curing period P2, significant viscosity change from low viscosity to high viscosity is observed. During the later curing period P3, the viscosity of the raw material composition increase at a slowerpace in a high viscosity state.

In the initial curing period P2, not only a change in viscosity of a raw material composition associated with its change from a liquid to a solid occurs, but also the volume thereof is changed, followed by shrinkage. As a result, as long as a pressure is not applied to the raw material composition, a molded product becomes poor in transferability. In order to improve transferability, it is required to apply a pressure to the raw material composition (pressure holding) to allow the raw material composition to adhere to the mold 20, as ell as to compensate the raw material composition from the gate part.

However, in the case of a low viscous material as in the case of the raw material composition of the present embodiment, when a pressure is applied in the state where the viscosity of the raw material is low, due to its low viscosity, unfavorable molding associated with formation of burrs (specifically, the material leaks from a gap between the fixed mold 22 and the movable mold 23 and is cured) occurs or a poor operation of a knockout pin is caused by infiltration of the raw material composition into a gap or the like around the knockout pin, or other troubles occur. On the other hand, even if a pressure is applied in the state where the viscosity is increased in the initial curing period P2 or in the later curing period P3, a thermosetting composition cannot be deformed by compression due to a high viscosity of the raw material composition, so as not to improve transferability. Therefore, in order to obtain a molded product having a high transferability, the timing at which pressure holding starts (pressure holding start time T) is required to be in conformity with the timing at which the introduction period P1 of the curing step is shifted to the initial curing period P2.

Here, if the viscosity of the raw material composition in the cavity 21 can be detected, the pressure holding start time T can be determined. However, in order to measure the viscosity of the raw material composition, it is necessary to incorporate an apparatus for measuring the raw material composition viscosity in the cavity 21 of the mold 20. This leads to an increase in size of the mold 20, complication of the mechanism, a significant increase in production cost, and hence, is not realistic.

The raw material composition in the present embodiment starts to shrink when the viscosity thereof is increased in the initial curing period P2. Therefore, if the time when shrinkage starts is detected, the pressure holding time T can be appropriately determined.

By conducting pressure holding under the above-mentioned conditions in the curing step, formation of sink marks or deformation of a molded product can be prevented, and transferability can be improved.

After completion of pressure holding for a certain period of time, as shown in FIG. 2(C), the needle 223 is advanced to block the opening part 222, and heated for a certain period of time so that a non-cured part is not generated, whereby the raw material composition is completely cured.

Here, by advancing the plunger 11 to fill the cavity 21 of the mold 20 with a thermosetting composition, and the time required for filling is taken as $t_1$. When the filling is completed, the plunger 11 stops. Further, when curing of the raw material composition starts, shrinkage of a thermosetting composition starts simultaneously. Therefore, after completion of the filling step, the plunger 11 starts to advance again. The time taken from the completion of the filling step to the re-start of advancement of the plunger 11 is taken as $t_2$, and the time taken for allowing the composition to be completely cured by further heating is taken as $t_3$, $t_1+t_2+t_3$ (the total time required for the filling step and the heat-curing step) is preferably 0.2 minute to 3 minutes, with 0.2 minute to 2 minutes being further preferable. If $t_1+t_2+t_3$ is less than 0.2 minute, un-curing may occur. $t_1+t_2+t_3$ of 3 minutes or longer is unfavorable in respect of mass producibility.

(Mold Releasing Step)

The mold releasing step corresponds to FIG. 2(D).

By releasing the movable mold 23 from the fixed mold 22, a cured product in the cavity can be taken out. If the mold releasing property is poor, an ejector mechanism may be appropriately provided in the mold.

[Cured Product]

The cured product of the invention (thermoset resin) can be obtained by curing by subjecting the thermosetting composition of the invention explained above to polymerization with heat. Preferably, it is a cured product obtained by molding by the production method of the invention.

The cured product of the invention can be preferably used as a reflector or the like for use in an optical semiconductor light-emitting device. A reflector obtained by using the cured product of the invention does not experience lowering in reflectance even when used for a long period of time. Further, it has a high reflectance in the visible range, has excellent heat resistance and weatherability, and is improved in adhesiveness to peripheral members.

The reflector of the invention has high reflectance in the visible range, and lowering in reflectance is small even when used for a long period of time. The light reflectance at a wavelength of 450 nm of the reflector of the invention is preferably 85% or more, more preferably 90% or more and further preferably 93% or more. The lowering in light reflectance from the initial light reflectance after the deterioration test conducted at 150° C. for 1,000 hours is preferably 20% or less, more preferably 15% or less, and further preferably 10% or less. The light reflectance can be determined by the method described in the Examples.

[Optical Semiconductor Light-Emitting Device]

The optical semiconductor light-emitting device of the invention includes the reflector of the invention as explained above. As for other configurations of the optical semiconductor light-emitting device, known configurations can be adopted.

Figure 4:
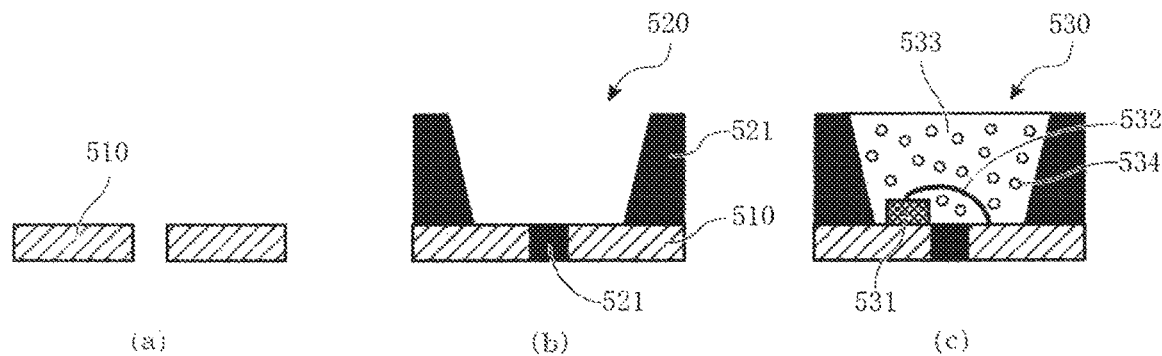
FIG. 4 is a schematic cross-sectional view showing one embodiment of a substrate for mounting an optical semiconductor device, which is constituted by using the thermosetting composition of the invention and an optical semiconductor light-emitting device of the invention, in which (a) is a cross-sectional view of a lead frame, (b) is a cross-sectional view of a substrate for mounting an optical semiconductor device and (c) is a cross-sectional view of an optical semiconductor light-emitting device.

The substrate for mounting the optical semiconductor device of the invention and the optical semiconductor light-emitting device of the invention will be further explained with reference to the drawings. FIG. 4 is a schematic cross-sectional view showing one embodiment of the substrate for mounting the optical semiconductor device of the invention and the optical semiconductor light-emitting device. FIG. 4(*a*) shows a lead frame 510.

FIG. 4(*b*) shows a substrate 520 for mounting an optical semiconductor device with a reflector 521 obtained by molding a resin molded product in the lead frame 510 shown in FIG. 4(*a*). The substrate 520 for mounting an optical semiconductor device has a concave part constituted of a bottom surface composed of the lead frame 510 and the reflector 521 and an inner peripheral side surface composed of the reflector 521. The resin molded body constituting the reflector 521 is obtained by curing the composition of the invention.

FIG. 4(*c*) shows an optical semiconductor light-emitting device 530 in which the optical semiconductor device 531 is mounted on the substrate for mounting an optical semiconductor device shown in FIG. 4(*b*), the optical semiconductor device 531 and another lead frame on which the optical semiconductor device 531 is not mounted are bonded by means of a wire 532, and the concave part is sealed with a transparent resin (sealing resin) 533. The inside of the sealing resin may contain a fluorescent product 534 for converting emitted light of blue or the like to white.

Further, it shows a schematic cross-sectional view showing another embodiment of the substrate for mounting an optical semiconductor device and the optical semiconductor light-emitting device of the invention.

Figure 5:
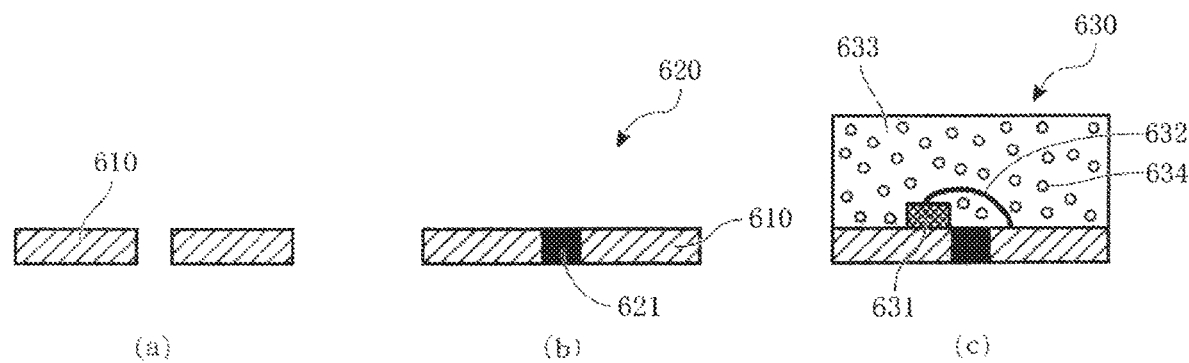
FIG. 5 is a schematic cross-sectional view showing another embodiment of the substrate for mounting an optical semiconductor device constituted by using the thermosetting composition of the invention and the optical semiconductor device, in which (a) is a cross-sectional view of a lead frame, (b) is a cross-sectional view of a substrate for mounting an optical semiconductor device and (c) is a cross-sectional view of an optical semiconductor light-emitting device.

FIG. 5(*a*) shows a lead frame 10.

FIG. 5(*b*) shows a substrate 620 for mounting an optical semiconductor device in which a resin molded product is molded as a reflector 621 between the lead frames 610 shown in FIG. 5(*a*). The substrate 620 for mounting an optical semiconductor device is provided with the reflector 621 between the lead frame 610 and the lead frame 610.

FIG. 5(*c*) shows an optical semiconductor light-emitting device 630 provided with the substrate for mounting an optical semiconductor device shown in FIG. 5(*b*). The optical semiconductor device 631 is mounted on the lead frame 610, and electrically connected by means of a bonding wire 632. Thereafter, a sealed resin part composed of a transparent sealing resin 633 is molded by curing comprehensively by transfer molding, compression molding or the like, thereby to seal the optical semiconductor device 631, and dicing is conducted to allow it to be pieces. In the inside of the sealed resin, a fluorescent body 634 for converting the emission color from blue to white may be contained.

The dimension and shape of each part of the substrate for mounting the optical semiconductor device are not particularly restricted, and can be appropriately set. The sealing resin (sealing material) is composed of an epoxy resin, a silicone resin, an acrylate resin or the like, for example.

EXAMPLES

The present invention will be explained in more detail with reference to the following examples, which should not be construed as limiting the scope of the invention.

Examples 1 to 30 and Comparative Examples 1 to 10

A thermosetting composition was prepared by using raw materials and with a composition ratio shown in Tables 1 to 4. Molded products were obtained under the molding conditions A or B, For preparation of a composition, first, the liquid components and the additive components were respectively weighed, and these components were mixed and stirred. Subsequently, inorganic components were respectively weighed and added, followed by stirring to obtain a composition. The inorganic components were incorporated in the order of the component (H), the component (G), the component (C) and the component (B).

As the stirring apparatus, a stirring apparatus that enables stirring by rotation and revolution was used. During the stirring, the rotation was conducted at a speed of 1,000 rpm and the revolution was conducted at a speed of 2,000 rpm, and the stirring was conducted for 1 minute.

[LTM Molding (Molding Conditions A)]

Molding machine: Liquid transfer molding machine G-Line, manufactured by Apic Yamada Corporation.

Flow channel temperature of a low-temperature part: 25° C.

Flow channel and shut-off method: Manual shut-off by using a syringe

Flow channel temperature of a high-temperature part and cavity temperature: The temperature was set at 150° C. when Perbutyl E was used as the additive, and the temperature was set at 130° C. when Perhexa HO was used as the additive.

Filling time: 10 seconds
Filling pressure: 2 MPa (priority was on the filling time)
Pressure holding time: 15 seconds
Pressure at the time of pressure holding: 5 MPa
Curing time: 90 seconds

[LIM Molding (Molding Conditions B)]

Molding machine: Liquid thermoset resin injection molding machine LA-40S, manufactured by Sodic Co., Ltd.

Flow channel temperature of the low-temperature part: 15° C.

Method for shutting off the flow channel and heat shut off method: Shut-off nozzle was used.

Temperature of flow channel of a high-temperature part and the cavity temperature: the temperature was set at 150° C. when Perbutyl E was used as the additive, and the temperature was set at 130° C. when Perhexa HC was used as the additive.

Filling time: 10 seconds
Pressure at the time of filling: 2 MPa (priority was put on the filling time)
Pressure holding time: 15 seconds
Pressure at the time of pressure holding: 5 MPa
Curing time: 90 seconds The components used for preparing the thermosetting composition were as follows:

[Component (A): (Meth)Acrylate Compound]

AM: Adamantyl methacrylate (M-104, manufactured by Idemitsu Kosan Co., Ltd. Viscosity at 25° C.: 10 mPa·s)

IBMA: 1-Isobornyl methycrylate (IB-X, manufacture by Kyoeisha Chemical Co., Ltd. Viscosity at 25° C.: 10 mPa·s)

[Components (D), (E) and (F): (Meth)Acrylate Compound]

LA: Lauryl acrylate (SR 5, manufactured by Alkema Co., Ltd.)

StMA: Stearyl methacrylate (manufactured by Kyoeisha Chemical Co., Ltd.)

SR351: Trimethylol propane triacrylate (manufactured by Alkema Co., Ltd.)

GMA: Glycidyl methacrylate (Blemmer GH, manufactured by NOF Corporation)

DCP: Tricyclodecane dimethanol dimethacrylate (manufactured by Shin-Nakamura Chemical Co., Ltd.)

A-DON-N: 1,10-decanediol diacrylate (manufactured by Shin-Nakamura Chemical Co., Ltd.)

3000 MK: Bisphenol A diglycidyl ether methacrylic acid adduct (3000 MK, manufactured by Kyoeisha Chemical Co., Ltd.)

MMA: Methyl methacrylate (manufactured by Hiroshima Wako Co., Ltd.)

[Component (B): Spherical Silica]

CRS1085-SF630: Spherical silica having an average particle size (D50) of 15 μm (manufactured by Tatsumori Ltd.)

CR1015-MSR35TS: Spherical silica having an average particle size (D50) of 15 μm (manufactured by Tatsumori Ltd.)
CRS1035-LER4: Spherical silica having an average particle size (D50) of 2 μm (manufactured by Tatsumori Ltd.)
TS12-046HA: Spherical silica having an average particle size (D50) of 15 μm (Nippon Steel Sumikin Material Co., Ltd, Micron Company)
[Component (C): White Pigment]
PC-3: Titanium oxide having an average particle size of 0.2 μm (manufactured by Ishihara Sangyo Kabushiki Kaisha)
[Component (G): Plate-Like Filler]
TP-A: Talc having an average particle size of 5 μm (manufactured by Fuji Talc Industries, Co., Ltd.)
[Component (H): Nano Particles]
R711: Fumed silica having a particle size of 5 to 50 nm (manufactured by Nippon Aerosil Co., Ltd.)
[Additive]
Tinuvin765: UV absorber (manufactured by BASF Japan Co., Ltd.)
StMg: Magnesium stearate (manufactured by NOF Corporation)
StZn: Zinc stearate (manufactured by Dainichi Chemical Industry)
Perbutyl E: Organic peroxide (manufactured by NOF Corporation)
Perhexa HC: Organic peroxide (manufactured by NOF Corporation)

For the composition prepared and the molded product obtained, the following evaluation was conducted. The results are shown in Tables 1 to 4.
(1) Viscosity Measurement Method
For the prepared composition, the melt viscosity was measured by means of a visco-elastic measurement apparatus under the following conditions:
Name of apparatus: Physica MCR301 manufactured by Anton Paar Company
Measurement method: Plate-plate
Plate diameter: 25 mmφ
Temperature: 25° C.
Distance between plates: 0.6 mm
Shear velocity: 1 to 200 (1/s)
In this shear velocity region, the shear viscosity at 10 (1/s) and 100 (1/s) are taken as the viscosity.
At the time of measurement, when measurement could not be conducted due to occurrence of slippage, in some cases, a normal force was applied in a range where the thickness was not changed.
(2) Storageability at Normal Temperature
The composition thus prepared was allowed to stand at 25° C. for 2 days. Thereafter, the composition was molded by using the mold. When short or burrs were not generated, the composition was evaluated as "○", when either short or burrs was generated, the composition was evaluated as "Δ", and when both were generated, the composition was evaluated as "×".

(3) Evaluation on Mold and Good Moldability
As for the mold for evaluating moldability, a mold with a width (10 mm)×a length (50 mm)×a thickness (1 mm) and having a vent at the flow end part with a thickness (5 mm)×a length (10 mm)×a thickness (0.03 mm) was used. As for the mold for evaluating properties, a mold with a width (50 mm)×a length (50 mm)×a thickness (2 mm) was used.
(3-1) Evaluation of Moldability
As for evaluation of moldability, occurrence of short was confirmed. The temperature of the mold was set to a predetermined temperature, and during a step of filling for 10 to 15 seconds, generation of voids or occurrence of un-filling in a molded product were confirmed visually. When both generation of voids and un-filling were occurred, the moldability was evaluated as ×, when either of them occurred, the moldability was evaluated as Δ, and when neither of them occurred, the moldability was evaluated as ○.
(3-2) Formation of Burrs
The temperature of the mold was set to a predetermined temperature, and during a step of filling for 10 to 15 seconds, formation of burrs as visually confirmed. When burrs were formed such that they exceeded the end part of the vent or burrs were formed from parts other than the vent, formation of burrs was evaluated as "×", when either of them occurred, formation of burrs was evaluated as "Δ", and when neither of them was occurred, the formation of burrs was evaluated as "○".
(4) Measurement of Light Reflectance
For the resulting molded product, using a spectrophotometer (product name: UV-2400PC) to which a multi-purpose large-sized sample chamber unit (product name: MPC-2200, manufactured by Shimadzu Corporation) was attached, the light reflectance of a sample piece of a cured product was measured.
(5) Energization Test of LED (Evaluation of Light Resistance)
On a LED package on which a blue-emitting LED (product name: OBL-CH2424 manufactured by GeneLite Inc.) was mounted, a test piece of a cured product was fixed, and was allowed to emit light by passing electric current for 1 week at an environment temperature of 60° C. at a current value of 150 mA. The LED light-irradiated surface of the test piece of a cured product was visually observed, and evaluated by the following standards.
○: No discoloration
×: Color of the light-irradiated surface was changed to be brown
(7) Bending Elastic Modulus and Bending Strength
For the obtained molded product, the bending elastic modulus and the bending strength were measured in accordance with ISO178.
(8) Evaluation of Heat Resistance
After measuring the initial light reflectance of the test piece of the cured product, the test piece was heated in an oven at 180° C. for 72 hours. Then, the light reflectance of the test piece after the heating was measured. When the difference was less than 5%, the heat resistance was evaluated as ○, when the difference was 5% or more and less than 10%, the heat resistance was evaluated as Δ, and when the difference was 10% or more, the heat resistance was evaluated as ×.

TABLE 1

|  |  |  | Ex. 1 | Ex. 2 | Ex. 3 | Ex. 4 | Ex. 5 | Ex. 6 | Ex. 7 | Ex. 8 | Ex. 9 | Ex. 10 |
| --- | --- | --- | --- | --- | --- | --- | --- | --- | --- | --- | --- | --- |
| Raw material | Monomer | AM | 6 |  | 8 |  | 7 |  | 6 |  |  | 7 |
|  |  | IBMA |  | 6 |  | 7 |  | 6 |  | 8 | 8 |  |
|  |  | LA | 6 | 6 | 7 | 6 | 5 | 5 | 6 | 4 | 4 | 5 |
|  |  | StMA |  |  |  |  |  |  |  |  |  |  |
|  |  | SR351 | 0.8 | 0.8 |  |  |  |  |  |  |  |  |
|  |  | GMA | 2.3 | 2.2 | 2 | 2 | 3 | 3 | 3 | 2 | 2 | 3 |

TABLE 1-continued

|  |  |  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|---|
|  |  | DCP |  |  | 3 | 5 |  |  |  |  |  |  |
|  |  | A-DOD-N |  |  |  |  | 5 | 6 |  | 6 | 6 | 5 |
|  |  | 3000MK |  |  |  |  |  |  | 5 |  |  |  |
|  |  | MMA |  |  |  |  |  |  |  |  |  |  |
|  | Silica | CRS1085-SF630 | 75 | 75 | 60 | 60 | 60 | 55 | 60 | 70 | 65 |  |
|  |  | CRS1015-MSR35TS |  |  |  |  |  |  |  |  |  | 60 |
|  |  | CRS1035-LER4 |  |  |  |  |  |  |  |  |  |  |
|  |  | TS12-046HA |  |  |  |  |  |  |  |  |  |  |
|  | White | PC-3 | 10 | 10 | 10 | 10 | 10 | 15 | 10 | 10 | 10 | 10 |
|  | Talc | TP-A25 |  |  |  | 10 | 10 | 10 | 10 | 10 | 5 | 10 |
|  | Additive | Tinuvin765 | 0.5 | 0.5 | 0.5 | 0.5 | 0.5 | 0.5 | 0.5 | 0.5 | 0.5 | 0.5 |
|  |  | StMg | 1.5 |  |  | 1.5 | 1.5 |  |  |  |  | 1.5 |
|  |  | StZn |  | 1 | 1.5 |  |  | 1.5 | 1 | 2 | 1.5 |  |
|  |  | R711 |  |  |  |  | 1 | 2 | 1 | 4 | 3 | 1 |
|  |  | Perbutyl E | 0.18 |  |  | 0.25 | 0.23 |  |  |  |  | 0.23 |
|  |  | Perhexa HC |  | 1 | 0.8 |  |  | 1 | 0.8 | 1 | 1 |  |
|  |  | CEL-W-7005 |  |  |  |  |  |  |  |  |  |  |
|  |  | Total [mass %] | 100 | 100 | 100 | 100 | 100 | 100 | 100 | 100 | 100 | 100 |
| Production method | Molding method |  | LTM | LTM | LTM | LTM | LTM | LTM | LTM | LTM | LTM | LTM |
|  | Whether the flow channel is shut off or not |  | Occurred | Occurred | Occurred | Occurred | Occurred | Occurred | Occurred | Occurred | Occurred | Occurred |
|  | Whether the flow channel is blocked or not |  | Not occurred | Not occurred | Not occurred | Not occurred | Not occurred | Not occurred | Not occurred | Not occurred | Not occurred | Not occurred |
| Results of evaluation | Occurrence of short |  | ○ | ○ | ○ | ○ | ○ | ○ | ○ | ○ | ○ | ○ |
|  | Formation of burrs |  | Δ | Δ | ○ | ○ | ○ | ○ | ○ | Δ | ○ | ○ |
|  | Storagibility at normal temperature |  | X | X | Δ | Δ | ○ | ○ | ○ | ○ | ○ | ○ |
|  | Shear viscosity [Pa·s] | 10(1/s) | 13 | 13 | 12 | 12 | 15 | 20 | 20 | 8 | 10 | 15 |
|  |  | 100(1/s) | 2 | 2 | 3 | 3 | 4 | 4 | 6 | 1 | 2 | 5 |
|  | Light reflectance [%] |  | 94 | 94 | 94 | 94 | 94 | 95 | 94 | 94 | 94 | 94 |
|  | Bending elastic modulus [MPa] |  | 7500 | 7500 | 6500 | 6500 | 6500 | 7000 | 6500 | 6000 | 6000 | 6500 |
|  | Bending strength [MPa] |  | 70 | 70 | 45 | 45 | 45 | 45 | 45 | 70 | 50 | 45 |
|  | Heat resistance |  | ○ | ○ | Δ | Δ | ○ | ○ | Δ | ○ | ○ | ○ |
|  | Light resistance |  | ○ | ○ | ○ | ○ | ○ | ○ | ○ | ○ | ○ | ○ |

TABLE 2

|  |  |  | Ex. 11 | Ex. 12 | Ex. 13 | Ex. 14 | Ex. 15 | Ex. 16 | Ex. 17 | Ex. 18 | Ex. 19 | Ex. 20 |
|---|---|---|---|---|---|---|---|---|---|---|---|---|
| Raw material | Monomer | AM |  | 6 |  | 7 |  | 4.5 |  | 15.75 |  | 6 |
|  |  | IBMA | 6 |  | 8 |  | 6 |  | 12.8 |  | 13.6 |  |
|  |  | LA | 5 | 6 | 4 | 5 | 5 | 4.5 | 6.4 | 11.25 | 11.25 | 6 |
|  |  | StMA |  |  |  |  |  |  |  |  |  |  |
|  |  | SR351 |  |  |  |  |  |  |  |  |  |  |
|  |  | GMA | 3 | 3 | 2 | 3 | 3 | 2.25 | 3.2 | 6.75 | 6.75 | 3 |
|  |  | DCP |  |  |  |  |  |  |  |  |  |  |
|  |  | A-DOD-N | 6 |  | 6 | 5 | 6 |  | 9.6 | 11.25 | 13.5 |  |
|  |  | 3000MK |  | 5 |  |  |  | 3.75 |  |  |  | 6 |
|  |  | MMA |  |  |  |  |  |  |  |  |  |  |
|  | Silica | CRS1085-SF630 |  |  |  |  |  |  |  |  |  |  |
|  |  | CRS1015-MSR35TS | 60 | 60 | 65 | 45 | 45 | 48 | 38 |  |  |  |
|  |  | CRS1035-LER4 |  |  |  | 15 | 15 | 17 | 15 |  |  |  |
|  |  | TS12-046HA |  |  |  |  |  |  |  | 35 | 35 | 60 |
|  | White | PC-3 | 10 | 10 | 10 | 10 | 10 | 10 | 10 | 10 | 10 | 10 |
|  | Talc | TP-A25 | 10 | 10 | 5 | 10 | 10 | 10 | 5 | 10 | 10 | 10 |
|  | Additive | Tinuvin765 | 0.5 | 0.5 | 0.5 | 0.5 | 0.5 | 0.5 | 0.5 | 0.5 | 0.5 | 0.5 |
|  |  | StMg |  |  |  | 1.5 |  | 1.5 | 1.5 | 1.5 | 1.5 | 1.5 |
|  |  | StZn | 1.5 | 1 | 1.5 |  | 1.5 |  |  |  |  |  |
|  |  | R711 | 2 | 2 | 0.5 | 2 | 3 | 3 | 0.5 | 3 | 3 | 3 |
|  |  | Perbutyl E |  |  |  | 0.23 |  | 0.23 | 0.23 | 0.23 | 0.23 | 0.23 |
|  |  | Perhexa H | 1 | 0.8 | 1 |  | 1 |  |  |  |  |  |
|  |  | CEL-W-7005 |  |  |  |  |  |  |  |  |  |  |
|  |  | Total [mass %] | 100 | 100 | 100 | 100 | 100 | 100 | 100 | 100 | 100 | 100 |

TABLE 2-continued

|  |  | Ex. 11 | Ex. 12 | Ex. 13 | Ex. 14 | Ex. 15 | Ex. 16 | Ex. 17 | Ex. 18 | Ex. 19 | Ex. 20 |
|---|---|---|---|---|---|---|---|---|---|---|---|
| Production method | Molding method | LIM | LIM | LIM | LIM | LIM | LIM | LIM | LIM | LIM | LIM |
|  | Whether the flow channel is shut off or not | Occurred | Occurred | Occurred | Occurred | Occurred | Occurred | Occurred | Occurred | Occurred | Occurred |
|  | Whether the flow channel is blocked or not | Not occurred | Not occurred | Not occurred | Not occurred | Not occurred | Not occurred | Not occurred | Not occurred | Not occurred | Not occurred |
| Results of evaluation | Occurrence of short | ○ | ○ | ○ | ○ | ○ | ○ | ○ | ○ | ○ | ○ |
|  | Formation of burrs | ○ | ○ | ○ | ○ | ○ | ○ | Δ | Δ | Δ | ○ |
|  | Storagibility at normal temperature | ○ | ○ | ○ | ○ | ○ | ○ | Δ | Δ | Δ | ○ |
|  | Shear viscosity [Pa·s] 10(1/s) | 20 | 40 | 12 | 14 | 15 | 50 | 14 | 8 | 8 | 45 |
|  | 100(1/s) | 5 | 9 | 3 | 3 | 3 | 15 | 3 | 2 | 2 | 10 |
|  | Light reflectance [%] | 94 | 94 | 94 | 94 | 94 | 94 | 94 | 94 | 94 | 94 |
|  | Bending elastic modulus [MPa] | 6500 | 6500 | 6500 | 6500 | 6500 | 13000 | 5500 | 4000 | 4000 | 5500 |
|  | Bending strength [MPa] | 45 | 45 | 50 | 45 | 45 | 40 | 40 | 35 | 35 | 40 |
|  | Heat resistance | ○ | Δ | ○ | ○ | ○ | Δ | ○ | ○ | ○ | Δ |
|  | Light resistance | ○ | ○ | ○ | ○ | ○ | ○ | ○ | ○ | ○ | ○ |

TABLE 3

|  |  |  | Ex. 21 | Ex. 22 | Ex. 23 | Ex. 24 | Ex. 25 | Ex. 26 | Ex. 27 | Ex. 28 | Ex. 29 | Ex. 30 |
|---|---|---|---|---|---|---|---|---|---|---|---|---|
| Raw material | Monomer | AM |  | 6 |  | 8 |  | 7 |  | 6 |  |  |
|  |  | IBMA | 8 |  | 6 |  | 7 |  | 6 |  | 8 | 8 |
|  |  | LA | 4 | 6 | 6 | 7 | 6 | 5 | 5 | 6 | 4 | 4 |
|  |  | StMA |  |  |  |  |  |  |  |  |  |  |
|  |  | SR351 |  | 0.75 | 0.75 |  |  |  |  |  |  |  |
|  |  | GMA | 2 | 2.25 | 2.25 | 2 | 2 | 3 | 3 | 3 | 2 | 2 |
|  |  | DCP |  |  |  | 3 | 5 |  |  |  |  |  |
|  |  | A-DOD-N | 6 |  |  |  |  | 5 | 6 |  | 6 | 6 |
|  |  | 3000MK |  |  |  |  |  |  |  | 5 |  |  |
|  |  | MMA |  |  |  |  |  |  |  |  |  |  |
|  | Silica | CRS1085-SF630 |  | 75 | 75 | 60 | 60 | 60 | 60 | 60 | 70 | 65 |
|  |  | CRS1015-MSR35TS |  |  |  |  |  |  |  |  |  |  |
|  |  | CRS1035-LER4 |  |  |  |  |  |  |  |  |  |  |
|  |  | TS12-046HA | 65 |  |  |  |  |  |  |  |  |  |
|  | White | PC-3 | 10 | 10 | 10 | 10 | 10 | 10 | 10 | 10 | 10 | 10 |
|  | Talc | TP-A25 | 5 |  |  | 10 | 10 | 10 | 10 | 10 |  | 5 |
|  | Additive | Tinuvin765 | 0.5 | 0.5 | 0.5 | 0.5 | 0.5 | 0.5 | 0.5 | 0.5 | 0.5 | 0.5 |
|  |  | StMg | 1.5 | 1.5 |  |  | 1.5 | 1.5 |  |  |  |  |
|  |  | StZn |  |  | 1 | 1.5 |  |  | 1.5 | 1 | 2 | 1.5 |
|  |  | R711 | 0.5 |  |  |  |  | 1 | 2 | 1 | 4 | 3 |
|  |  | Perbutyl E | 0.23 | 0.18 |  |  | 0.25 | 0.23 |  |  |  |  |
|  |  | Perhexa HC |  |  | 1 | 0.8 |  |  | 1 | 0.8 | 1 | 1 |
|  |  | CEL-W-7005 |  |  |  |  |  |  |  |  |  |  |
|  |  | Total [mass %] | 100 | 100 | 100 | 100 | 100 | 100 | 100 | 100 | 100 | 100 |
| Production method | Molding method |  | LIM | LIM | LIM | LIM | LIM | LIM | LIM | LIM | LIM | LIM |
|  | Whether the flow channel is shut off or not |  | Occurred | Not occurred | Not occurred | Not occurred | Not occurred | Not occurred | Not occurred | Not occurred | Not occurred | Not occurred |
|  | Whether the flow channel is blocked or not |  | Not occurred | Occurred | Occurred | Occurred | Occurred | Occurred | Occurred | Occurred | Occurred | Occurred |
| Results of evaluation | Occurrence of short |  | ○ | ○ | ○ | ○ | ○ | ○ | ○ | ○ | ○ | ○ |
|  | Formation of burrs |  | ○ | Δ | Δ | ○ | ○ | ○ | ○ | ○ | Δ | ○ |
|  | Storagibility at normal temperature |  | ○ | Δ | Δ | Δ | Δ | ○ | ○ | ○ | ○ | ○ |
|  | Shear viscosity [Pa·s] 10(1/s) |  | 25 | 13 | 13 | 12 | 12 | 15 | 18 | 20 | 8 | 12 |
|  | 100(1/s) |  | 6 | 2 | 2 | 3 | 3 | 4 | 4 | 6 | 1 | 2 |
|  | Light reflectance [%] |  | 94 | 94 | 94 | 94 | 94 | 94 | 94 | 94 | 94 | 94 |
|  | Bending elastic modulus [MPa] |  | 6500 | 7500 | 7500 | 6500 | 6500 | 6500 | 6500 | 5500 | 6000 | 6500 |
|  | Bending strength [MPa] |  | 50 | 50 | 50 | 45 | 45 | 45 | 45 | 40 | 70 | 50 |
|  | Heat resistance |  | ○ | ○ | ○ | Δ | Δ | ○ | ○ | Δ | ○ | ○ |
|  | Light resistance |  | ○ | ○ | ○ | ○ | ○ | ○ | ○ | ○ | ○ | ○ |

TABLE 4

|  |  |  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 |
|---|---|---|---|---|---|---|---|---|---|---|
| Raw material | Monomer | AM |  | 2 |  | 2 |  |  |  | 2 |
|  |  | IBMA | 24 |  | 24 |  |  |  | 24 |  |
|  |  | LA | 12 | 1 | 12 | 1 |  | 5 | 12 | 1 |
|  |  | StMA |  |  |  |  |  |  |  |  |
|  |  | SR351 |  |  |  |  |  |  |  |  |
|  |  | GMA | 6 | 1 | 6 | 1 |  |  | 6 | 1 |
|  |  | DCP |  |  |  |  |  |  |  |  |
|  |  | A-DOD-N | 18 | 2 | 18 | 2 |  | 5 | 18 | 2 |
|  |  | 3000MK |  |  |  |  |  |  |  |  |
|  |  | MMA |  |  |  |  |  | 10 |  |  |
|  | Silica | CRS1085-SF630 | 30 | 69 | 30 | 69 |  | 70 | 30 | 69 |
|  |  | CRS1015-MSR35TS |  |  |  |  |  |  |  |  |
|  |  | CRS1035-LER4 |  |  |  |  |  |  |  |  |
|  |  | TS12-046HA |  |  |  |  |  |  |  |  |
|  | White | PC-3 | 10 | 25 | 10 | 25 |  | 10 | 10 | 25 |
|  | Talc | TP-A25 |  |  |  |  |  |  |  |  |
|  | Additive | Tinuvin765 | 0.5 | 0.5 | 0.5 | 0.5 |  | 0.5 | 0.5 | 0.5 |
|  |  | StMg | 1.5 |  | 1.5 |  |  |  | 1.5 |  |
|  |  | StZn |  | 1.5 |  | 1.5 |  | 1.5 |  | 1.5 |
|  |  | R711 |  |  |  |  |  |  |  |  |
|  |  | Perbutyl E |  | 1 |  | 1 |  |  |  | 1 |
|  |  | Perhexa HC | 1 |  | 1 |  |  | 1 | 1 |  |
|  |  | CEL-W-7005 |  |  |  |  | 100 |  |  |  |
|  | Total [mass %] |  | 100 | 100 | 100 | 100 | 100 |  | 100 | 100 |
| Production method | Molding method |  | LTM | LTM | LIM | LIM | LIM | LIM | LIM | LIM |
|  | Whether the flow channel is shut off or not |  | Occurred | Occurred | Occurred | Occurred | Occurred | Occurred | Occurred | Occurred |
|  | Whether the flow channel is blocked or not |  | Not occurred | Not occurred | Not occurred | Not occurred | Not occurred | Not occurred | Not occurred | Not occurred |
| Results of evaluation | Occurrence of short |  | ○ | X | ○ | X | — | ○ | ○ | X |
|  | Formation of burrs |  | X | Δ | X | Δ | — | X | X | Δ |
|  | Storagibility at normal temperature |  | X | Δ | X | Δ | — | X | X | ○ |
|  | Shear viscosity [Pa·s] | 10(1/s) | 2 | 750 | 2 | 750 | >1000 | 8 | 2 | 750 |
|  |  | 100(1/s) | 0.1 | 40 | 0.1 | 40 | >1000 | 1 | 0.1 | 40 |
|  | Light reflectance [%] |  | 94 | 95 | 94 | 95 | — | 94 | 94 | 94 |
|  | Bending elastic modulus [MPa] |  | 2000 | 13000 | 2000 | 13000 | — | 5500 | 2000 | 13000 |
|  | Bending strength [MPa] |  | 30 | 30 | 30 | 30 | — | 40 | 30 | 30 |
|  | Heat resistance |  | ○ | ○ | ○ | ○ | — | X | ○ | ○ |
|  | Light resistance |  | ○ | ○ | ○ | ○ | — | X | ○ | ○ |

INDUSTRIAL APPLICABILITY

The composition and the cured product of the invention can be preferably used as the raw material for a reflector of an optical semiconductor light-emitting device.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The Japanese application specification claiming priority under the Paris Convention are incorporated herein by reference in its entirety.

The invention claimed is:

1. A thermosetting composition, consisting of:
(A) a meth(acrylate) compound having a viscosity at 25° C. of 1 to 300 mPa·s with which a substituted or unsubstituted alicyclic hydrocarbon group including 6 or more carbon atoms is ester-bonded;
(B) spherical silica;
(C) at least one selected from the group consisting of titanium dioxide and barium sulfate:
(D) a (meth)acrylic acid or a monofunctional (meth) acrylate compound having a polar group;
(G) talc;
at least one selected from the group consisting of kaolin, sericite, glass flakes, synthetic hydrotalcite, a metal foil, graphite, molybdenum disulfide, tungsten disulfide, and boron nitride: and
(H) nano particles,
wherein the thermosetting composition has a shear viscosity at 25° C. and 10 s$^{-1}$ of Pa·s or more and 500 Pa·s or less and a shear viscosity at 25° C. and 100 s$^{-1}$ of 0.3 Pa·s or more and 100 Pa·s or less.

2. The thermosetting composition according to claim 1, wherein:
a content of the component (B) is 10 to 90 mass %; and
a content of the component (C) is 3 to 50 mass %, relative to 100 mass % of a total of the components (A) to (C).

3. The thermosetting composition according to claim 1, wherein the substituted or unsubstituted alicyclic hydrocarbon group including 6 or more carbon atoms in the (meth) acrylate compound (A) is one or more selected from the group consisting of a substituted or unsubstituted adamantyl group, a substituted or unsubstituted norbornyl group, a substituted or unsubstituted isobornyl group, and a substituted or unsubstituted dicyclopentanyl group.

4. The thermosetting composition according to claim 1, wherein:
a content of the component (C) is 3 to 50 mass %; and
a content of the component (B) is 10 to 90 mass %, relative to 100 mass % of a total of the components (A) to (D).

5. The thermosetting composition according to claim 1, wherein the spherical silica is subjected to a (meth)acrylsilane surface treatment.

6. The thermosetting composition according to claim 1, wherein an average particle size of primary particles of the spherical silica is 0.1 to 100 µm.

7. The thermosetting composition according to claim 1, wherein the titanium dioxide is present.

8. The thermosetting composition according to claim 1, wherein the barium sulfate is present.

* * * * *

UNITED STATES PATENT AND TRADEMARK OFFICE
CERTIFICATE OF CORRECTION

| | | |
|---|---|---|
| PATENT NO. | : 10,668,650 B2 | Page 1 of 1 |
| APPLICATION NO. | : 15/321517 | |
| DATED | : June 2, 2020 | |
| INVENTOR(S) | : Yutaka Obata et al. | |

It is certified that error appears in the above-identified patent and that said Letters Patent is hereby corrected as shown below:

On the Title Page

Item (73), the Assignee's name is incorrect. Item (73) should read:
-- (73) Assignee: IDEMITSU KOSAN CO., LTD., Chiyoda-ku (JP) --

Signed and Sealed this
Fourth Day of August, 2020

Andrei Iancu
*Director of the United States Patent and Trademark Office*